US012733127B2

(12) United States Patent
Clark et al.

(10) Patent No.: US 12,733,127 B2
(45) **Date of Patent: *Sep. 8, 2026**

(54) SHROUDS WITH COOLING INSERTS

(71) Applicant: Dell Products L.P., Round Rock, TX (US)

(72) Inventors: Emily Clark, Round Rock, TX (US); Timothy Shedd, Lithia, FL (US); Hasnain Shabbir, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 291 days.

This patent is subject to a terminal disclaimer.

(21) Appl. No.: 18/648,691

(22) Filed: Apr. 29, 2024

(65) Prior Publication Data

US 2024/0341056 A1 Oct. 10, 2024

Related U.S. Application Data

(63) Continuation-in-part of application No. 18/296,694, filed on Apr. 6, 2023, now Pat. No. 12,317,445.

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01)

(58) Field of Classification Search
CPC .............................. H05K 7/20145; G06F 1/20
See application file for complete search history.

(56) References Cited

U.S. PATENT DOCUMENTS

| | | | | |
|---|---|---|---|---|
| 7,474,528 | B1 * | 1/2009 | Olesiewicz | H05K 7/20154 361/695 |
| 7,542,289 | B2 * | 6/2009 | Tsai | H05K 7/20727 361/695 |
| 9,648,730 | B2 * | 5/2017 | Harvilchuck | H05K 1/0272 |
| 2010/0294469 | A1 * | 11/2010 | Chou | G06F 1/20 165/185 |
| 2019/0204883 | A1 | 7/2019 | Chu et al. | |
| 2021/0321528 | A1 * | 10/2021 | Curtis | H05K 7/2039 |
| 2022/0026965 | A1 | 1/2022 | Chen et al. | |
| 2023/0371209 | A1 * | 11/2023 | Rasalingam | H05K 7/20509 |

* cited by examiner

*Primary Examiner* — Mukundbhai G Patel
(74) *Attorney, Agent, or Firm* — Fogarty LLP

(57) ABSTRACT

Shrouds with cooling inserts. In various embodiments, a shroud may include a cover portion; a baffle portion coupled to, or integrated into the cover portion, where the baffle portion is configured to direct fluid flow towards the cover portion; and a plurality of cooling inserts coupled to, or integrated into, the cover portion, where the cooling inserts are disposed in parallel with respect to each other.

17 Claims, 18 Drawing Sheets

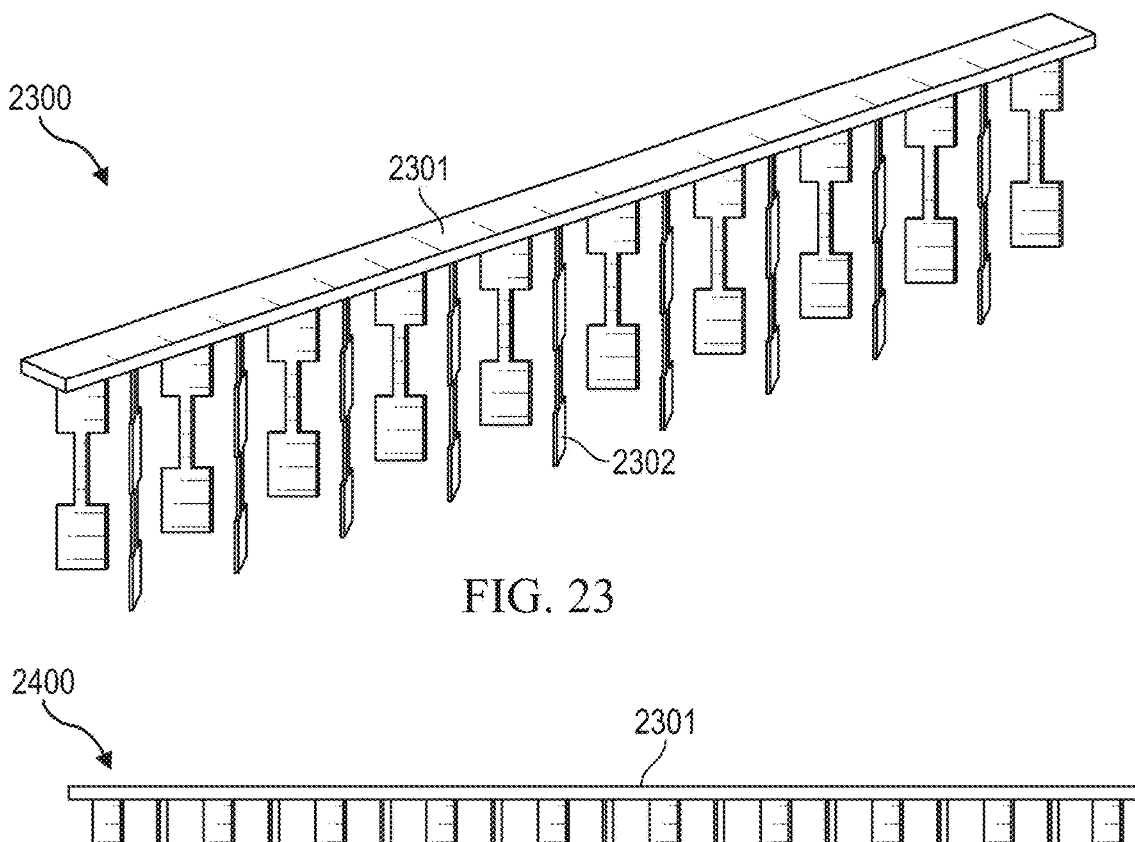
FIG. 23
FIG. 24
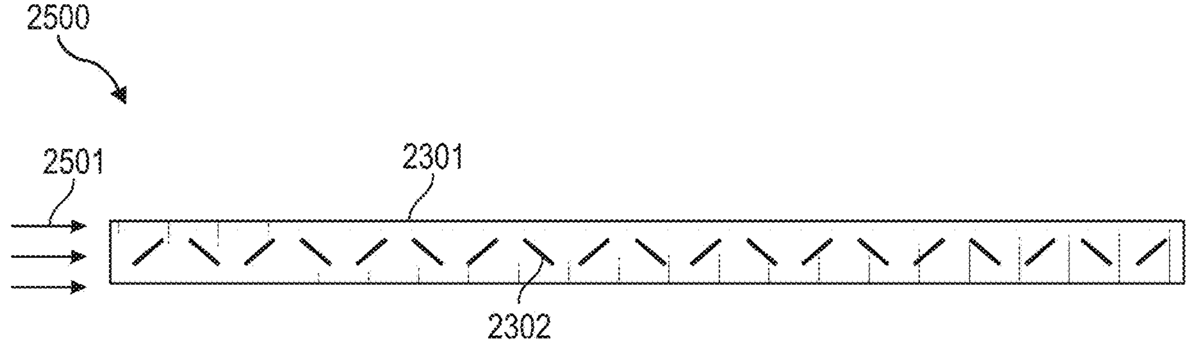
FIG. 25

SHROUDS WITH COOLING INSERTS

CROSS-REFERENCE TO RELATED APPLICATION

This patent application a continuation-in-part of, and claims priority to, U.S. patent application Ser. No. 18/296,694, titled "SIMPLIFIED AIR FLOW ENHANCEMENT FOR COMPONENT COOLING" and filed on Apr. 6, 2023, the disclosure of which is hereby incorporated herein by reference in its entirety.

FIELD

This disclosure relates generally to Information Handling Systems (IHSs), and more specifically, to cooling inserts for shrouds.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use, such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Shrouds with cooling inserts are described. In an illustrative, non-limiting embodiment, a shroud may include a cover portion; a baffle portion coupled to, or integrated into the cover portion, where the baffle portion is configured to direct fluid flow towards the cover portion; and a plurality of cooling inserts coupled to, or integrated into, the cover portion, where the cooling inserts are disposed in parallel with respect to each other.

At least one of the cooling inserts may include supports coupled to or integrated into the cover; and twists coupled between two or more of the supports. A first twist may have a first directional rotation, and a second twist may have a second directional rotation opposite the first directional rotation.

The first directional rotation may cause a first fluid flow having a third directional rotation that is substantially similar to the first directional rotation. The second directional rotation may cause a second fluid flow having a fourth direction rotation substantially similar to the second directional rotation.

The first twist may include a cutout. The cutout may have a shape selected from the group consisting of: a circle, a semi-circle, an oblong, an ellipse, a triangle, a rectangle, and a square. The cutout may be disposed at a center of the first twist, or at an edge of the first twist.

At least one of the cooling inserts may include an insert portion coupled to, or integrated into the cover, and the insert portion may include posts selected from the group consisting of: a cylindrical post, an airfoil post, and a vane.

The cover portion may be configured to be deployed over a portion of an Information Handling System (IHS) comprising two or more components or modules disposed in parallel with respect to each other, and the at least one of the cooling inserts may be configured to be disposed between the two or more components or modules.

The cover portion may include two or more slots configured to prevent, upon installation, respective ones of the two or more components from moving in a direction perpendicular to the cooling inserts. The cover portion may also include two or more detents configured to prevent, upon installation, respective ones of the two or more components from moving in a direction parallel to the cooling inserts.

At least one of the components comprises: a memory module, a Central Processing Unit (CPU), a Graphical Processing Unit (GPU), an audio Digital Signal Processor (aDSP), a Neural Processing Unit (NPU), a Tensor Processing Unit (TSU), a Neural Network Processor (NNP), an Intelligence Processing Unit (IPU), an Image Signal Processor (ISP), or a Video Processing Unit (VPU).

In another illustrative, non-limiting embodiment, a shroud assembly may include: a cover; a cooling insert module coupled to an underside of the cover; and a baffle coupled to, or integrated into the cover, where the baffle is configured to direct fluid flow towards the cooling insert module.

The cooling insert module may include a top portion and a plurality of cooling inserts coupled to, or integrated into, the top portion, and the cooling inserts may be disposed in parallel with respect to each other.

Additionally, or alternatively, the cooling inserts may include at least one of: (a) supports coupled to a top portion and twists coupled between two or more of the supports; or (b) posts coupled to the top portion. For example, the twists may include at least one of: a cutout or a tapered twist. The posts may include at least one of: a cylindrical post, an airfoil post, or a vane.

In yet another illustrative, non-limiting embodiment, an IHS may include a first component disposed in parallel with respect to a second component; and a shroud deployed over the first and second components, where the shroud comprises cooling inserts between the first and second components.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

FIGS. 23-26 are diagrams illustrating an example of an air cooling insert with vanes and associated features, according to some embodiments.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price.

An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 1:
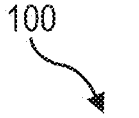
FIG. 1 is a diagram illustrating examples of air cooling inserts for dual in-line memory modules of an Information Handling System (IHS), according to some embodiments.
Figure 1:
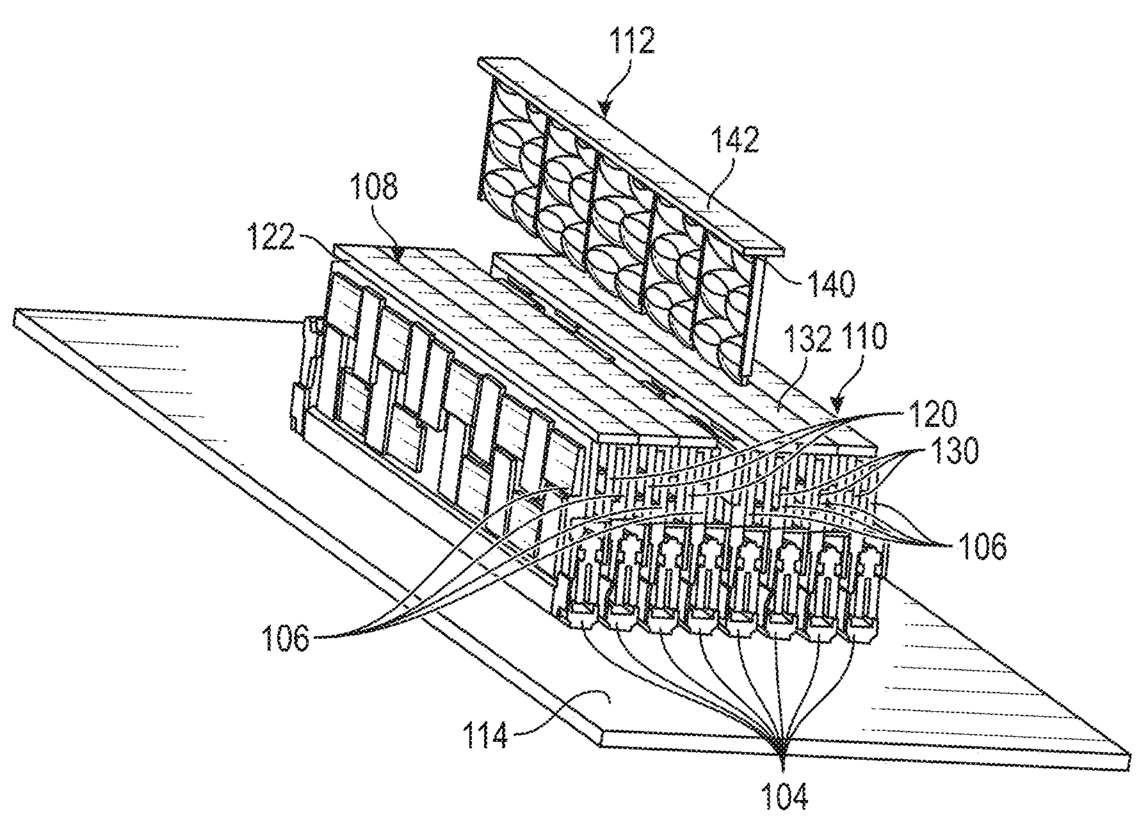

FIG. 1 illustrates a portion of Information Handling System (IHS) 100 including a simplified air flow enhancement for dual in-line memory module (DIMM) cooling according to at least one embodiment of the present disclosure.

IHS 100 includes Printed Circuit Board (PCB) 114, multiple DIMM slots 104, multiple DIMMs 106, multiple air cooling inserts 108 and 110, and single air cooling insert 112. In an example, PCB 114 may be any suitable board including, but not limited to, a motherboard of an information handling system, such as IHS 2700 of FIG. 27.

Multiple air cooling insert 108 include any suitable number of inserts 120 and top portion 122. Similarly, multiple air cooling insert 110 includes any suitable number of inserts 130 and top portion 132. Single air cooling insert 112 includes insert 140 and top portion 142.

While multiple air cooling inserts 108 and 110 and single air cooling insert 112 will be described herein with respect to providing air cooling to DIMMs 106, the air cooling inserts may be utilized to air cooling any components, such as solid state device memories or the like, having a planar or flat surface in an IHS without varying from the scope of this disclosure. In some cases, examples of planar components may include components having at least one semiconductor package with a flat surface, typically mounted on a PCB or module. IHS 100 may include any additional components without varying from the scope of this disclosure.

In certain examples, both of multiple air cooling inserts 108 and 110 may include any suitable number of air cooling inserts, such as two, three, four, or the like. In an example, multiple air cooling inserts 108 and 110 and single air cooling insert 112 may be utilized to air cooling N+1 DIMMs 106.

For example, single air cooling insert 112 may be inserted in between two DIMMs 106 and the single air cooling insert may provide air cooling to the two DIMMs. Multiple air cooling inserts 108 and 110 may include three air cooling inserts and each of the air cooling inserts may be inserted between two DIMMs 106. In this example, the three air cooling inserts of multiple air cooling inserts 108 may provide air cooling to four DIMMs 106.

In certain examples, air cooling inserts may be added to or removed from multiple air cooling inserts 108 and 110 so that the multiple air cooling inserts may provide air cooling to any suitable number of DIMMs 106.

As illustrated in FIG. 1, DIMM slots 104 may be in both physical and electrical communication with PCB 114. DIMM slots 104 may also have a predefined spacing between each of the DIMM slots, such that DIMMs 106 may also have a predefined spacing between each of the DIMMs. Based on the predefined spacing between DIMMs 106, air cooling inserts of multiple air cooling inserts 108 and 110 and single air cooling insert 112 may be formed without the spacing being measured.

Multiple air cooling inserts 108 and 110 and single air cooling insert 112 may be formed in any suitable material, such as an injection-molded polymer, a compressible material, metal, or the like.

In an example, inserts 120 of multiple air cooling insert 108 may be placed in physical communication with a DIMM 106 on each side of the insert. When inserts 120 are fully positioned within DIMMs 106, a bottom surface of top portion 122 may be placed in physical communication with a top surface of each DIMM 106. In certain examples, the physical communication between top portion 122 and a top surface of DIMMs 106 may prevent air flow from escaping upwards and instead force the air flow along the surfaces of the DIMMs.

In an example, inserts 130 and top portion 132 of multiple air cooling insert 110 may interface with DIMMs 106 in a substantially similar manner as described with respect to inserts 120 and top portion 122 of multiple air cooling insert 108.

In certain examples, insert 140 of single air cooling insert 112 may be placed in physical communication with DIMMs 106 on each side of the insert. When insert 140 is fully positioned between DIMMs 106, a bottom surface of top portion 142 may be placed in physical communication with a top surface of both DIMM 106. In certain examples, the physical communication between top portion 142 and a top surface of DIMMs 106 may prevent air flow from escaping upwards and instead force the air flow along the surfaces of the DIMMs.

In an example, top portion 142 may extend substantially halfway over each DIMM 106 to prevent upward air flow and enable top portion 122 or 132 to extend halfway over a corresponding 106. In another example, top portion 142 may fit within the edges of corresponding DIMMs 106 such that a physical communication between the top portion and the DIMMs may prevent air flow from escaping upwards and instead force the air flow along the surfaces of the DIMMs.

Figures 2, 3:
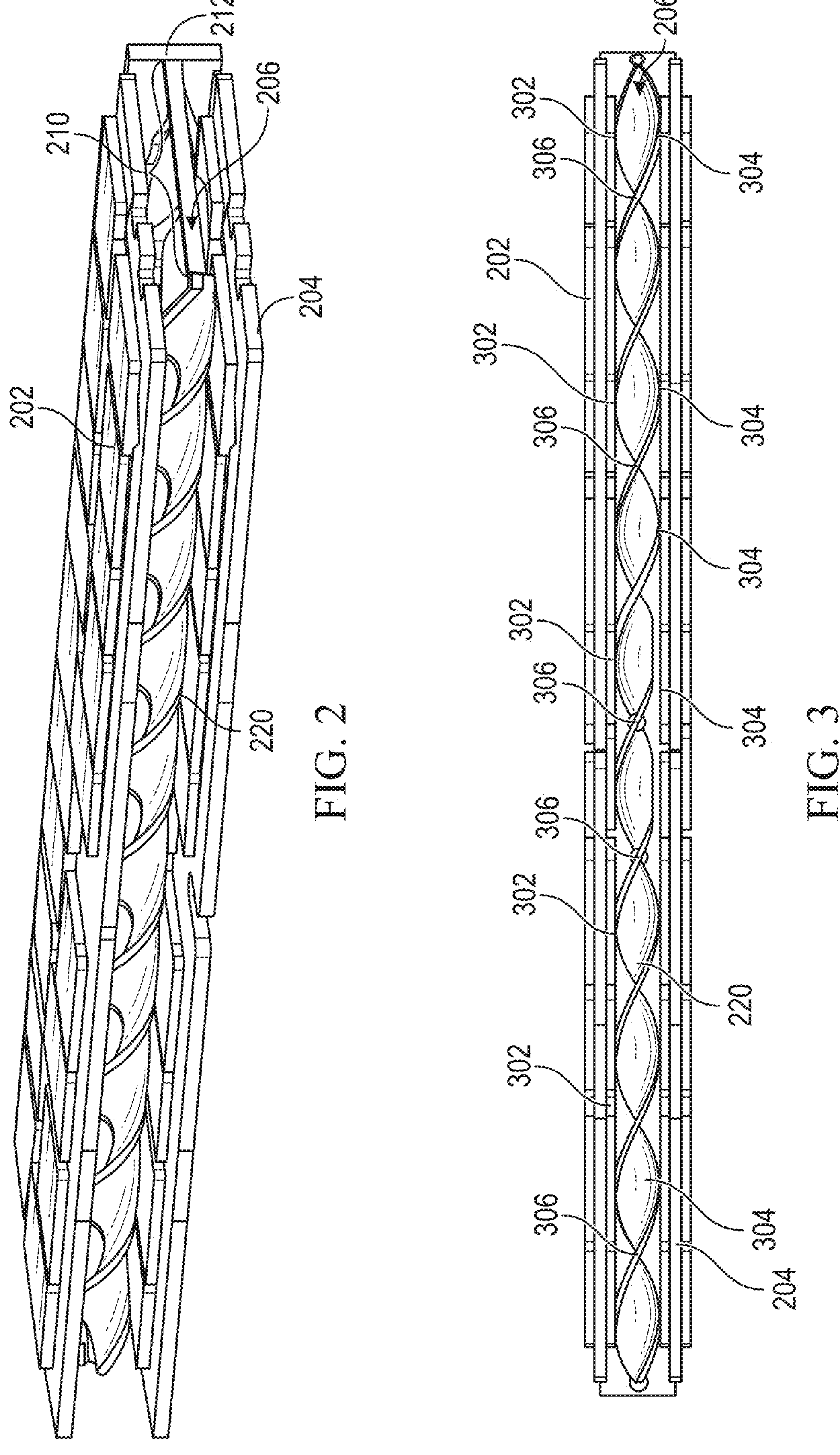
FIGS. 2 and 3 are diagrams illustrating examples of an air cooling insert located between two dual in-line memory modules, according to some embodiments.

FIGS. 2 and 3 illustrate components 202 and 204 and single air cooling insert 206 located in between the components according to at least one embodiment of the present disclosure. Components 202 and 204 may be substantially similar to DIMMs 106 of FIG. 1.

Single air cooling insert 206 may be substantially similar to single air cooling insert 112 of FIG. 1. Single air cooling insert 206 includes insert portion 210 and top portion 212.

In an example, a first surface of insert portion 210 may be in physical communication with a surface of component 202 and a second surface of the insert portion may be in physical communication with a surface of component 204. Single air cooling insert 206 may be any suitable material and may have any suitable amount of compressibility. While insert portion 210 may be compressible, an amount that the insert portion may compress may not exceed an amount that may cause the insert portion to no longer have spirals 220.

Referring now to FIG. 3, single air cooling insert 206 is located between components 202 and 204 and different portions of spiral 220 may be in physical communication with the components. For example, spiral 220 of single air cooling insert 206 may be in physical communication with component 202 at multiple points 302, and may be in physical communication with component 204 at multiple points 304.

In an example, at points 306 between points of contact 302 and 304, spiral 220 may not be in physical communication with components 202 and 204. In certain examples, spiral 220 may control the air flow between components 202 and 204 as will be described below. While air cooling insert 206 is in physical communication with components 202 and 204 at multiple points 302, the heat transfer to cool the components is from the components to the air flow. Thus, the physical communication between the components and the air cooling insert does not substantially contribute to heat transfer and cooling of the components.

Figure 4:
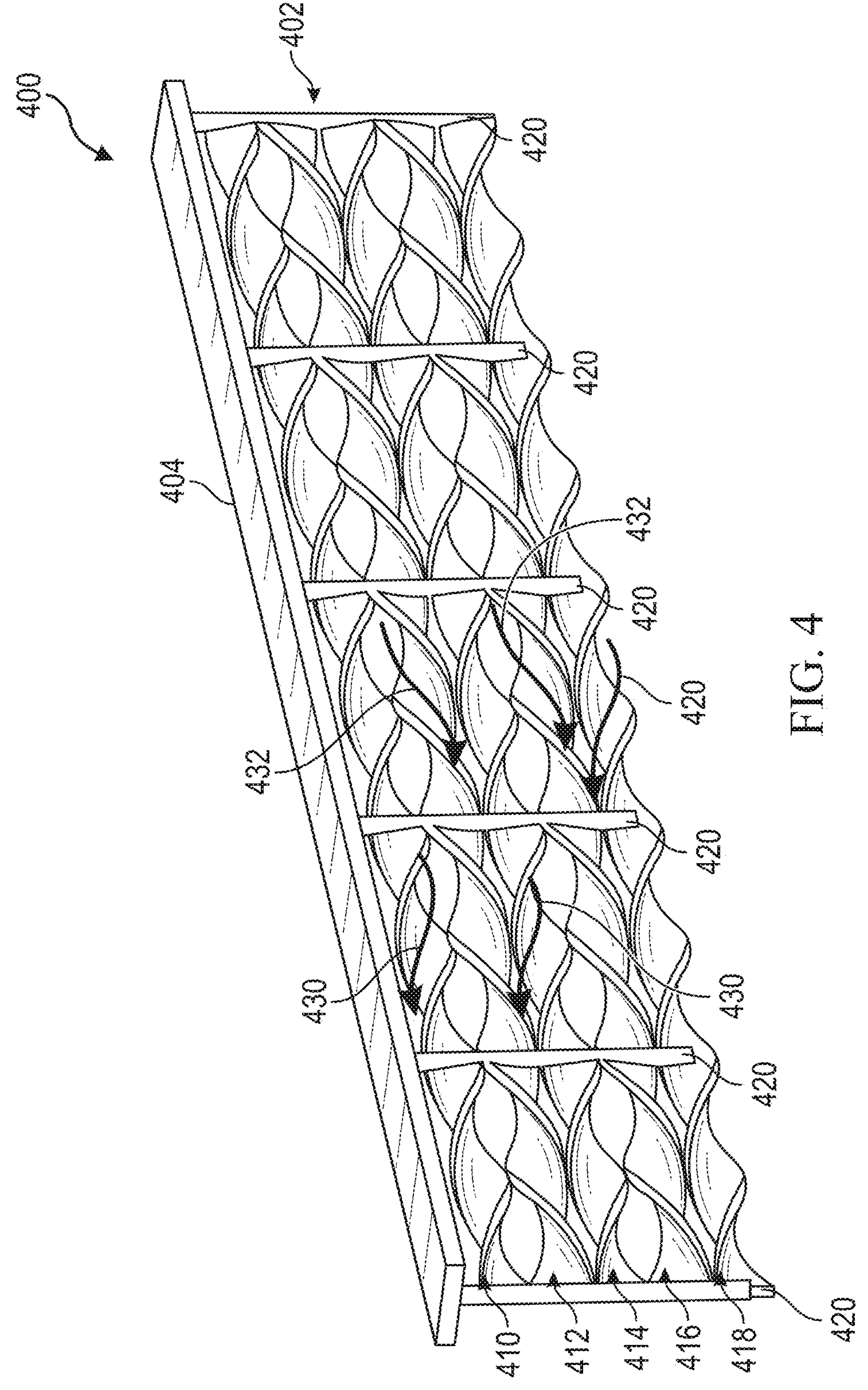
FIG. 4 is a diagram illustrating an embodiment of an air cooling insert, according to some embodiments.

FIG. 4 illustrates air cooling insert 400 according to at least one embodiment of the present disclosure. Air cooling insert 400 may be substantially similar to single air cooling insert 112 of FIG. 1 and air cooling insert 206 of FIGS. 2 and 3.

Air cooling insert 400 includes insert portion 402 and top portion 404. Insert portion 402 may include any suitable number of twists including, but not limited to, twists 410, 412, 414, 416, and 418. Insert portion 402 also includes multiple supports 420 extending down from top portion 404.

In an example, supports 420 may strengthen insert portion 402 and may maintain a desired distance between twists 410, 412, 414, 416, and 418. One of ordinary skill in the art will recognize that descriptions of figures having only a single air cooling insert may be applied to a multiple air cooling insert.

Similarly, one of ordinary skill in the art will recognize that descriptions of figures having a multiple air cooling insert may be applied to a single air cooling insert. In an example, twists 410, 412, 414, 416, and 418 may include any suitable number of turns from one end of insert portion 402 to the other end of the insert portion.

Additionally, twists 410, 412, 414, 416, and 418 may include any suitable size of turns or twists. In an example, each of twists 410, 412, 414, 416, and 418 may rotate or turn in an opposite or counter direction with respect to a neighboring twist.

For example, twist 410 may rotate in a first direction and twist 412 may rotate in an opposite or counter direction. Similarly, twist 414 may rotate in an opposite direction of twist 412, and twist 416 may be opposite of twist 414. Twist 418 may rotate in the opposite direction of twist 416. In this example, every other twist may rotate in a similar direction. For example, twists 410, 414, and 418 may twist in the same direction, and twists 412 and 416 may twist in the same direction that is opposite of the rotation for twists 410, 414, and 418. In certain examples, the counter-rotating between adjacent twists may ensure efficient air flow through air cooling insert 400.

In certain examples, rotation of twists 410, 412, 414, 416, and 418 may control air flow through air cooling insert 400. For example, twists 410, 414, and 418 may cause a first directional rotation of an air flow 430, and twists 412 and 416 may cause a second directional rotation of an air flow 432.

As illustrated in FIG. 4, the directional rotations of air flows 430 and 432 may be opposite or counter to each other. In an example, the opposite directional rotations of air flows 430 and 432 may result increases air cooling of components within an IHS.

Figure 5:
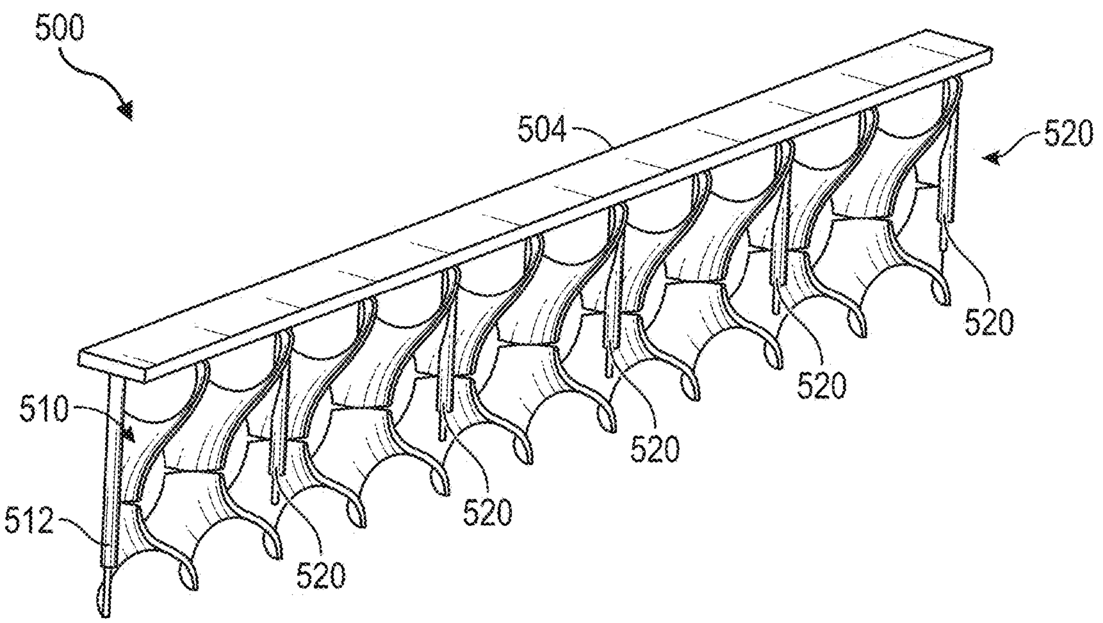
FIG. 5 is a diagram illustrating another embodiment of an air cooling insert, according to some embodiments.

FIG. 5 illustrates air cooling insert 500 according to at least one embodiment of the present disclosure. Air cooling insert 500 may be substantially similar to single air cooling insert 112 of FIG. 1 and air cooling insert 206 of FIGS. 2 and 3.

Air cooling insert 500 includes insert portion 502 and top portion 504. Insert portion 502 may include any suitable number of air flow directing components including, but not limited to, top air flow direction component 510 and bottom air flow directing component 512. Insert portion 502 also includes multiple supports 520.

In an example, supports 520 may strengthen insert portion 502 and may maintain a desired distance between top air flow direction component 510 and bottom air flow directing component 512. In another example, insert portion 502 may include a gap between top air flow direction component 510 and bottom air flow directing component 512 to allow a particular amount of air flow to travel through the gap.

In certain examples, top air flow direction component 510 may twist and slant a first direction, and bottom air flow directing component 512 may twist and slant in the opposite direction. The different directions of top air flow direction component 510 and bottom air flow directing component 512 may cause different air flows through insert portion 502.

Figure 6:
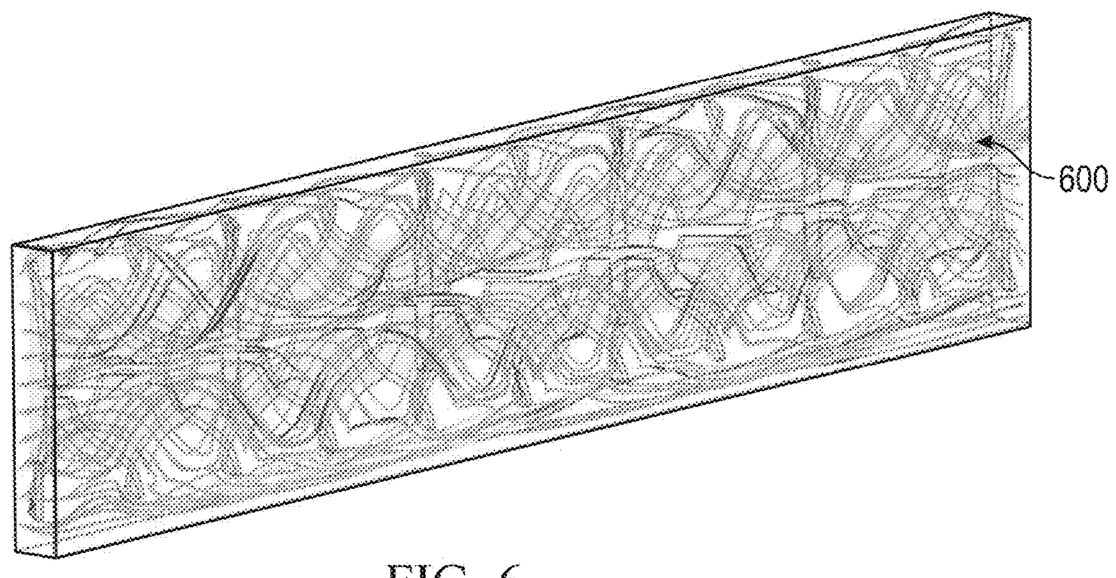
FIG. 6 is a diagram illustrating air flow through an air cooling insert, according to some embodiments.

FIG. 6 illustrates air flow 600 through an air cooling insert according to at least one embodiment of the present disclosure. In an example, air flow 600 may be associated with multiple air cooling inserts 108 and 110 of FIG. 1, single air cooling insert 112 of FIG. 1, air cooling insert 206 of FIGS. 2 and 3, air cooling insert 400 of FIG. 4, and air cooling insert 500 of FIG. 5.

In an example, air flow 600 may include secondary and tertiary flow structures through an associated air cooling insert, and these flow structures may significantly enhance thermal performance for planar or flat component in an IHS without additional surface area. In certain examples, pressure loss between the planar or flat components may be negatively impacted, but air flow requirements may be much less than required otherwise. While multiple air cooling inserts 108 and 110 of FIG. 1, single air cooling insert 112 of FIG. 1, air cooling insert 206 of FIGS. 2 and 3, air cooling insert 400 of FIG. 4, and air cooling insert 500 of FIG. 5 are an obstruction in a channel between components, such as DIMMs, in an IHS, the air cooling inserts may produce a heat transfer enhancement through air flow modification.

In certain examples, multiple air cooling inserts 108 and 110 of FIG. 1, single air cooling insert 112 of FIG. 1, air cooling insert 206 of FIGS. 2 and 3, air cooling insert 400 of FIG. 4, and air cooling insert 500 of FIG. 5 may reduce surface temperatures of components, such as DIMMs, of an IHS by any particular amount.

The amount of surface temperature reduction may include, but is not limited to, 15° C., 20° C., 30° C. or more as compared to the same air flow in an open channel.

Air cooling inserts 108 and 110 of FIG. 1, single air cooling insert 112 of FIG. 1, air cooling insert 206 of FIGS. 2 and 3, air cooling insert 400 of FIG. 4, and air cooling insert 500 of FIG. 5 may decrease a required air flow to achieve same cooling result by any particular amount, such as 3× reduction, 3.5× reduction, 4× reduction, or the like.

Figure 7:
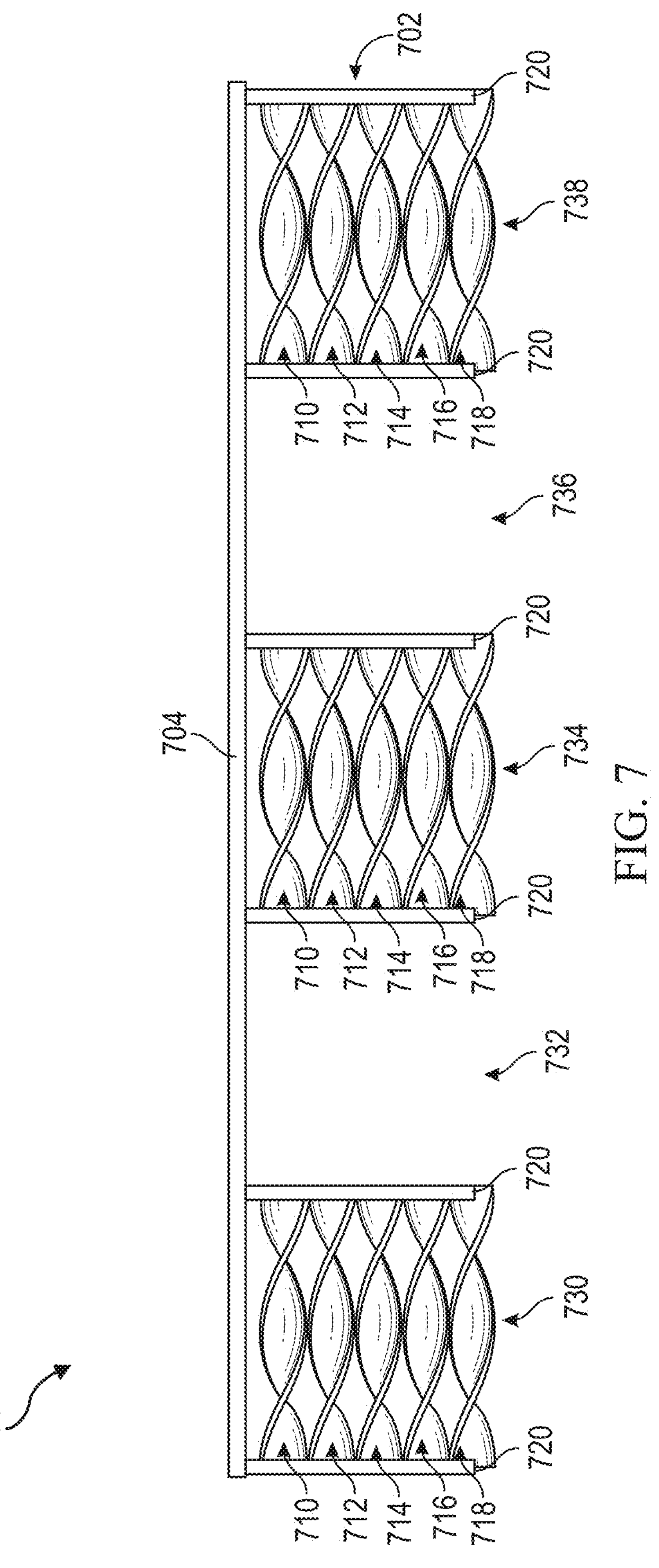
FIG. 7 is a diagram illustrating another embodiment of an air cooling insert, according to some embodiments.

FIG. 7 illustrates an air cooling insert 700 according to at least one embodiment of the present disclosure. Air cooling insert 700 may be substantially similar to single air cooling insert 112 of FIG. 1 and air cooling insert 206 of FIGS. 2 and 3.

Air cooling insert 700 includes insert portion 702 and top portion 704. Insert portion 702 may include any suitable number of twists including, but not limited to, twists 710, 712, 714, 716, and 718. Insert portion 702 also includes multiple supports 720 extending down from top portion 704. In an example, supports 720 may strengthen insert portion 702 and may maintain a desired distance between twists 710, 712, 714, 716, and 718.

In an example, insert portion 702 may be separated into multiple columns or sections 730, 732, 734, 736, and 738. In this example, each section 730, 732, 734, 736, and 738 may be bounded by a different support 720 on each side of the section. In certain examples, some of columns 730, 732, 734, 736, and 738 may include twists 710, 712, 714, 716, and 718 and other columns may not include the twists. For example, columns 730, 734, and 738 may include twists 710, 712, 714, 716, and 718, and columns 732 and 738 may not include twists.

In certain examples, columns 730, 732, 734, 736, and 738 may be different lengths. In an example, columns 732 and 738 without twists may be a short length, such as a length to fit around components of a DIMM. For example, column 732 may fit around a Power Management Integrated Circuit (PMIC) of a DIMM. In an example, twists 710, 712, 714, 716, and 718 may control air flow within air cooling insert 700 as described above with respect to twists 410, 412, 414, 416, and 418 of FIG. 4.

Figure 8:
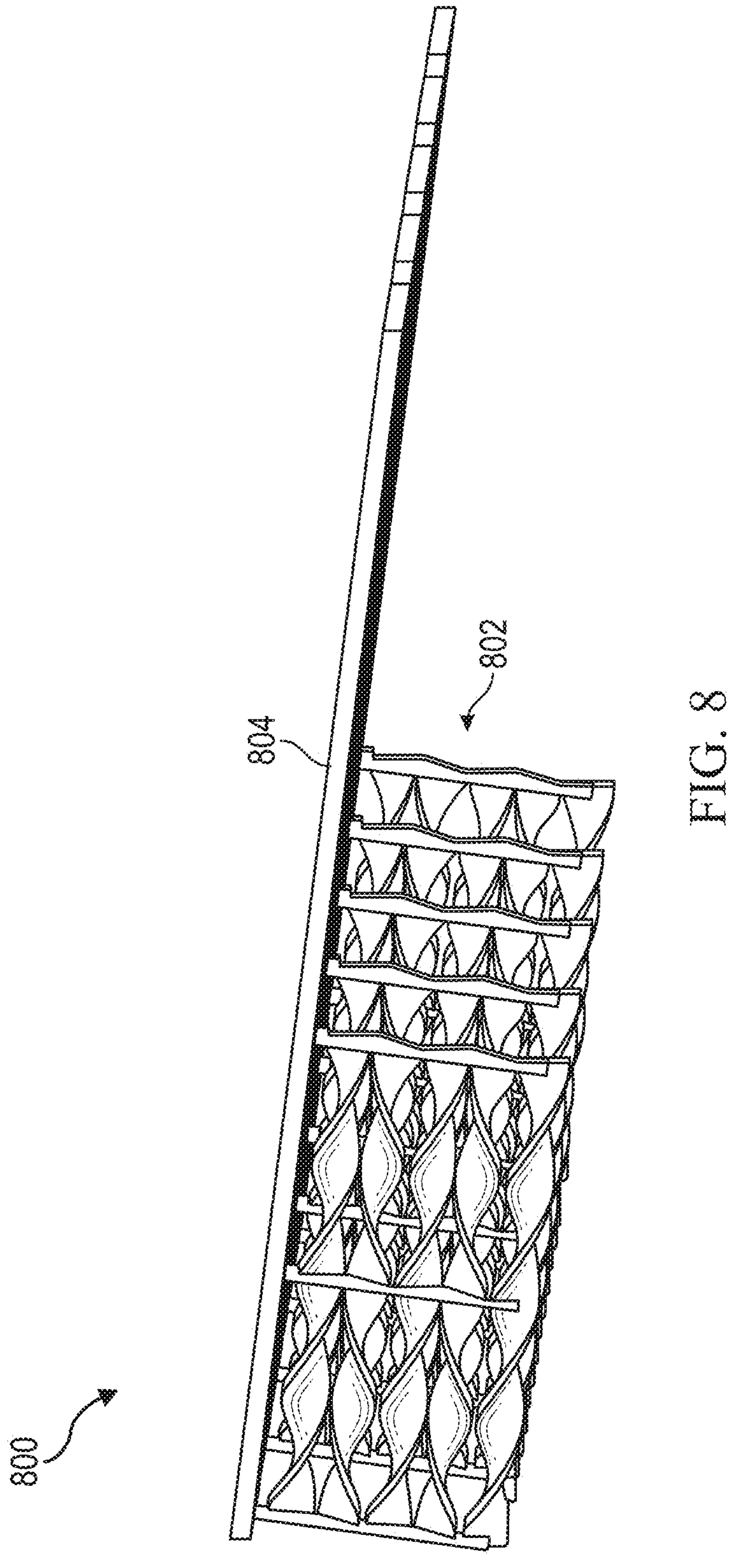
FIG. 8 is a diagram illustrating another embodiment of an air cooling insert, according to some embodiments.

FIG. 8 illustrates an air cooling insert 800 according to at least one embodiment of the present disclosure. Air cooling insert 800 may be substantially similar to multiple air cooling inserts 108 and 110 of FIG. 1. Air cooling insert 800 includes insert portions 802 and top portion 804.

In an example, insert portions 802 may extend any suitable length along top portion 804. For example, insert portions 802 may extend a quarter of the length of top portion 804, half the length of the top portion, three-quarters of the length of the top portion, or the like. In an example, twists of insert portions 802 may control air flow within air cooling insert 800 as described above with respect to twists 410, 412, 414, 416, and 418 of FIG. 4.

In various applications, the inventors hereof have determined that air cooling inserts mix the air flow between planar or flat surfaces and therefore enhance heat transfer, but they may also lead to higher pressures (than configurations without inserts). To address this, and other concerns, FIGS. 9-13 illustrate air cooling inserts 900-1300 with cutouts.

In various embodiments, each air cooling insert 900-1300 may be substantially similar to single air cooling insert 112 of FIG. 1 and air cooling insert 206 of FIGS. 2 and 3, but with different geometries and/or cutouts. These modified structures may provide thermal enhancements with a reduced pressure penalty. For example, cutouts may reduce the pressure between two planar or flat surfaces by allowing for flow bypass across individual inserts.

Figures 9, 10:
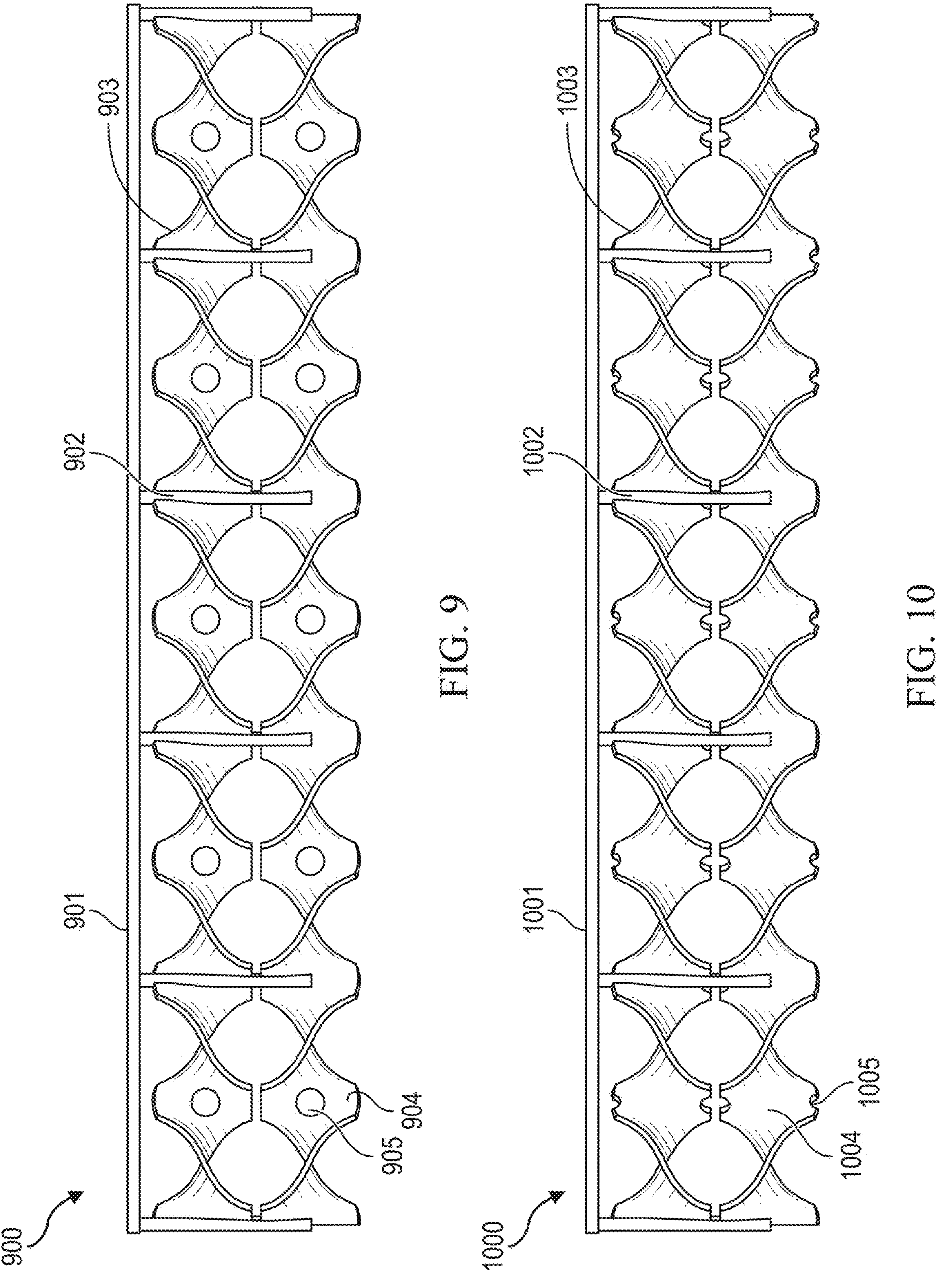
FIGS. 9-13 are diagrams illustrating examples of air cooling inserts with cutouts, according to some embodiments.

In that regard, FIG. 9 shows air cooling insert 900 with insert portion 903 and top portion 901. Insert portion 903 may include any suitable number of twists. Insert portion 903 may also include multiple supports 902 extending down from top portion 901. Supports 902 may strengthen insert portion 903 and may maintain a desired distance between twists. In this case, each twist 904 of insert portion 903 may have a similar twist and slant geometry as shown in FIG. 5, but with circular cutouts 905 on every other twist.

FIG. 10 shows air cooling insert 1000 with insert portion 1003 and top portion 1001. Insert portion 1003 may include any suitable number of twists. Insert portion 1003 may also include multiple supports 1002 extending down from top portion 1001. Supports 1002 may strengthen insert portion 1003 and may maintain a desired distance between twists. In this case, each twist 1004 of insert portion 1003 may have a similar twist and slant geometry as shown in FIG. 5, but with circular cutouts 1005 on the edges of twists.

Figures 11, 12:
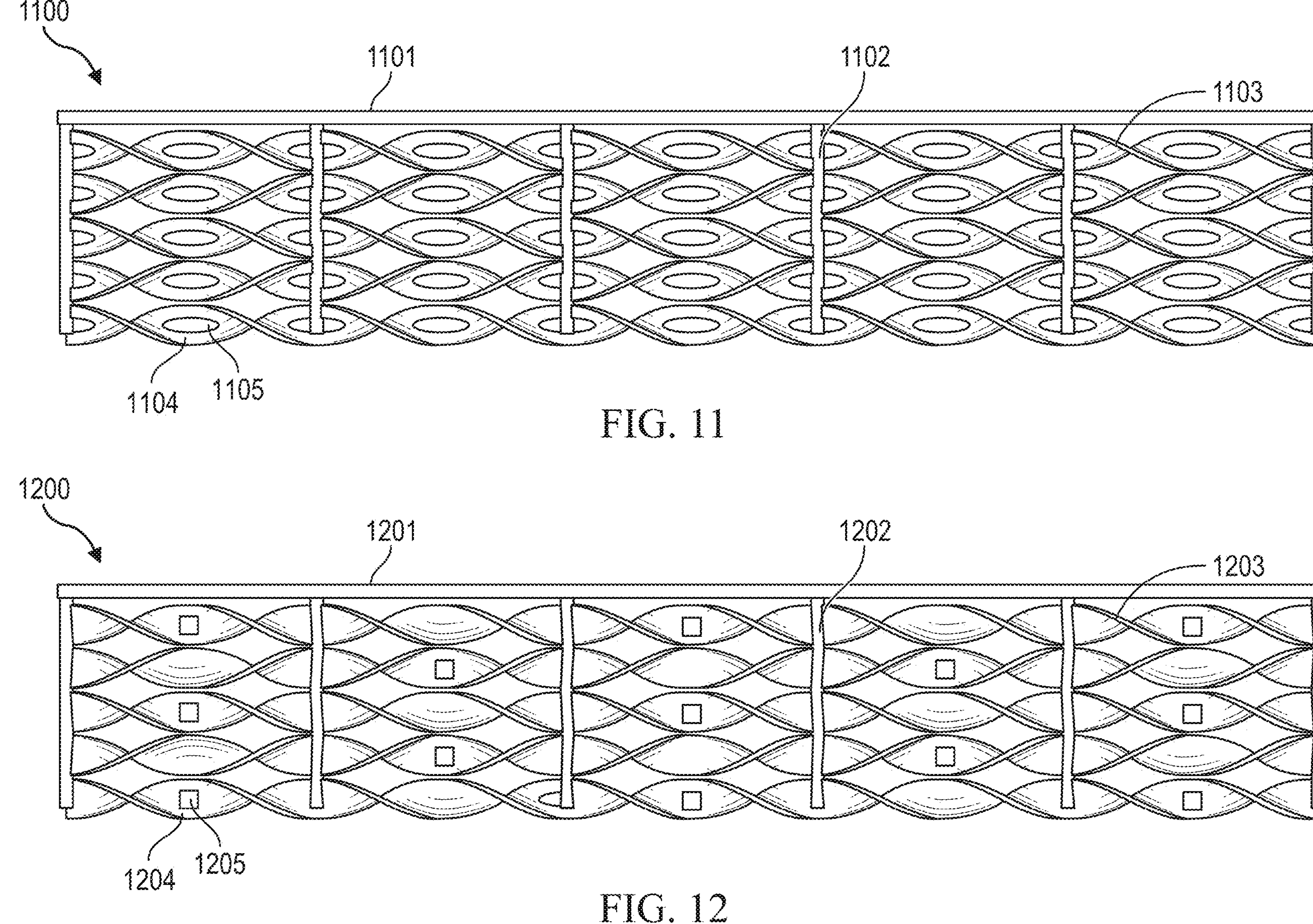

FIG. 11 shows air cooling insert 1100 with insert portion 1103 and top portion 1101. Insert portion 1103 may include any suitable number of twists. Insert portion 1103 may also include multiple supports 1102 extending down from top portion 1101. Supports 1102 may strengthen insert portion 1103 and may maintain a desired distance between twists. In this case, each twist 1104 of insert portion 1103 may have a similar geometry as shown in FIG. 4, but with elliptical cutouts 1105 on all twists.

FIG. 12 shows air cooling insert 1200 with insert portion 1203 and top portion 1201. Insert portion 1203 may include any suitable number of twists. Insert portion 1203 may also include multiple supports 1202 extending down from top portion 1201. Supports 1202 may strengthen insert portion 1203 and may maintain a desired distance between twists. In this case, each twist 1204 of insert portion 1203 may have a similar geometry as shown in FIG. 4, but with square cutouts 1205 on alternating twists.

Figures 13, 14:
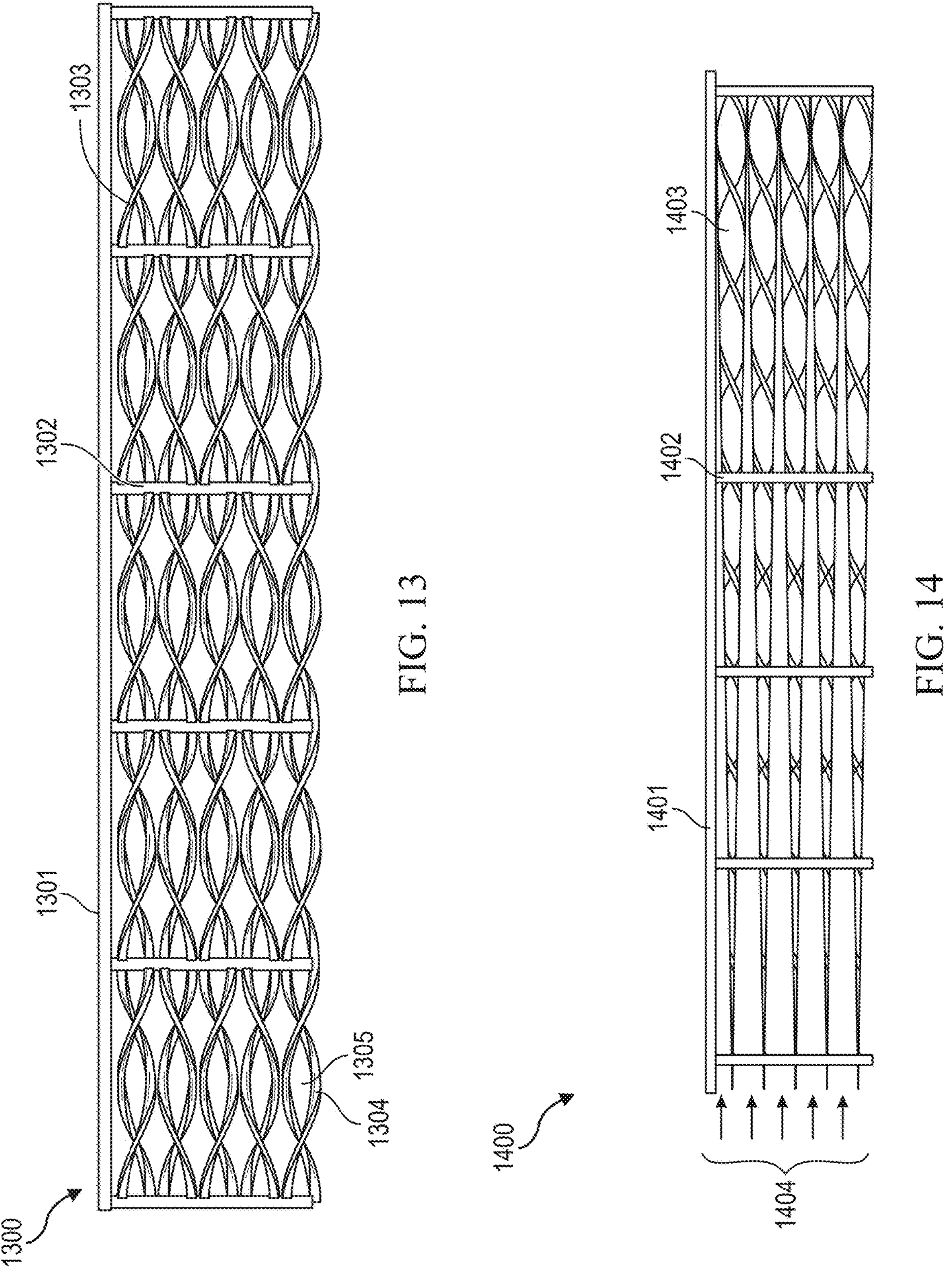
FIG. 14 is a diagram illustrating an example of a tapered air cooling insert, according to some embodiments.

FIG. 13 shows air cooling insert 1300 with insert portion 1303 and top portion 1301. Insert portion 1303 may include any suitable number of twists. Insert portion 1303 may also include multiple supports 1302 extending down from top portion 1301. Supports 1302 may strengthen insert portion 1303 and may maintain a desired distance between twists. In this case, each twist 1304 of insert portion 1303 may have a similar geometry as shown in FIG. 4, but with circular axial cutouts 1305.

In various embodiments, cutouts may be provided in any number of geometric shapes including, but not limited to, circles, semi-circles, oblongs, ellipses, triangles, rectangles, and squares. Additionally, or alternatively, cutouts may be provided in the center of twists and/or at their edges. Additionally, or alternatively, cutouts may be provided in any suitable pattern including, but not limited to, on every twist, every other twist, between twists, etc. Moreover, a plurality of air cooling inserts with the same or different cutouts may be provided in parallel as a multiple cooling insert similar to the example shown in FIG. 8.

As the inventors hereof have also recognized, another way to achieve thermal enhancements with reduced pressure penalties is to provide an air cooling insert with a tapered insert portion. A tapered profile may gradually introduce an obstruction to the flow, as opposed to an abrupt change.

In some cases, larger twists may be placed downstream where heat transfer enhancement is needed the most. In other cases, the relative sizes of twists along an air cooling insert may follow a temperature profile of an IHS component. For example, twists above or next to hot spots on a surface of SoC or processor's packaging may be larger than twists above other non-critical areas of the packaging.

FIG. 14 is a diagram illustrating an example of tapered air cooling insert 1400. Particularly, air flow 1404 travels along insert 1400 from left to right. Tapered air cooling insert 1400 includes insert portion 1403 and top portion 1401. Insert portion 1403 may include any suitable number of twists. Insert portion 1403 may also include multiple supports 1402 extending down from top portion 1401. Supports 1402 may strengthen insert portion 1403 and may maintain a desired distance between twists. In this case, each twist 1404 of insert portion 1403 may have a similar geometry as shown in FIG. 4, but with progressively or gradually increasing sizes from left to right.

In various embodiments, systems and methods described herein may provide for cooling inserts that utilize other geometries (e.g., cylindrical posts, airfoil posts, vanes, etc.) for mixing a fluid (e.g., air, oil, etc.) flowing between two or more planar or flat surfaces. In different applications, because different fluids have different properties (e.g., viscosity, etc.), alternatives to the twist and/or twist and slant geometries may be preferred. Here it should be noted that any cooling insert described herein, even if specifically designated "air cooling insert," may be used with any suitable cooling fluid, gas, or liquid.

Figure 15:
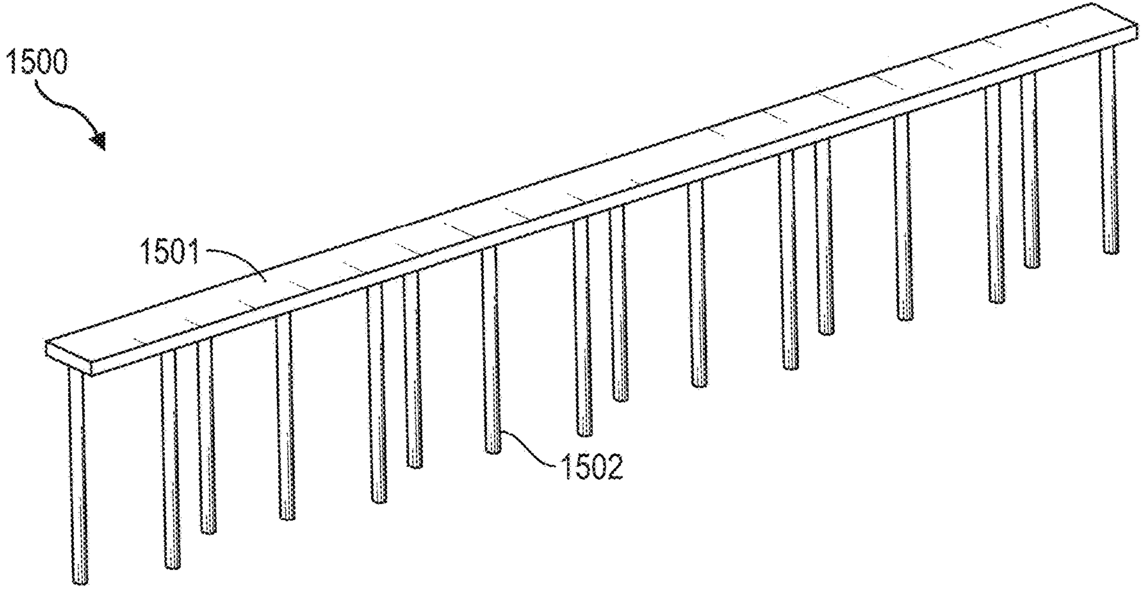
FIGS. 15-18 are diagrams illustrating an example of an air cooling insert with cylindrical posts and associated features, according to some embodiments.
Figure 16:
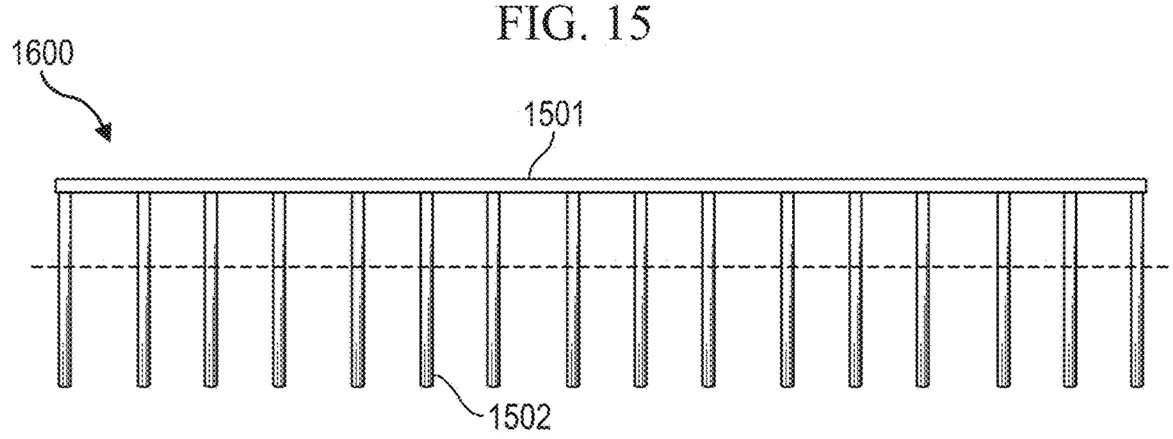
Figure 17:
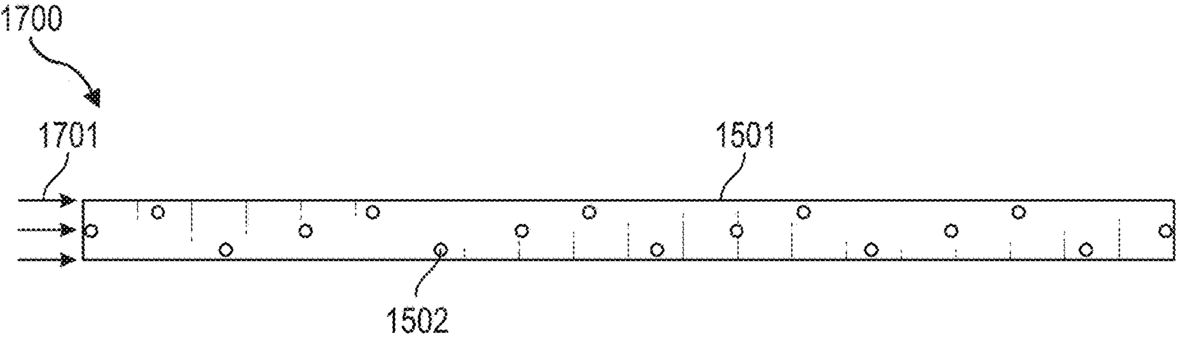
Figure 18:
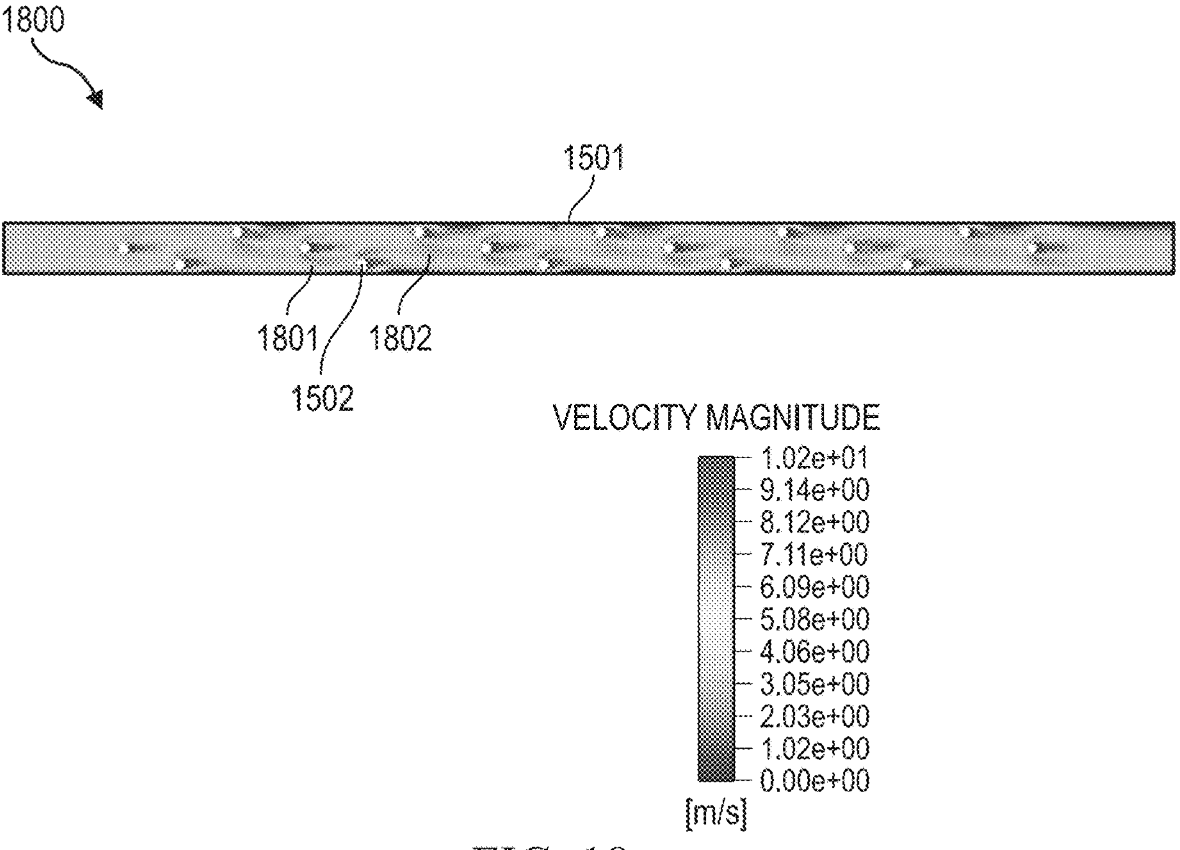

FIGS. 15-18 are diagrams illustrating an example of an air cooling insert with cylindrical posts and associated features. FIG. 15 shows isometric view 1500 of an air cooling insert having top portion 1501 and cylindrical posts 1502 vertically integrated or coupled thereto. FIG. 16 shows lateral view 1600 of the air cooling insert. FIG. 17 shows top view 1700 and indicates the flow direction of fluid 1701. In various embodiments, the number of cylindrical posts 1502, the distance between cylindrical posts 1502, and/or the arrangement of cylindrical posts 1502 may be selected based, at least in part, upon a viscosity of fluid 1701. FIG. 18 shows top view 1800 of the air cooling insert overlayed upon a velocity map of flow 1701, indicating velocity enhancements 1801 and serpentine flow pattern 1802. In some deployments, a plurality of air cooling inserts with cylindrical posts may be provided in parallel as a multiple cooling insert similar to the example shown in FIG. 8.

Figure 19:
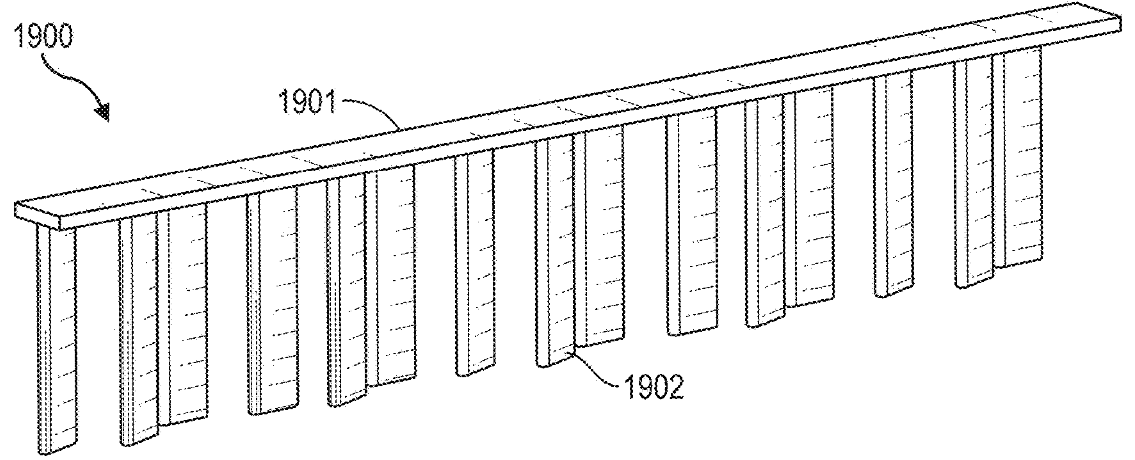
FIGS. 19-22 are diagrams illustrating an example of an air cooling insert with airfoil posts and associated features, according to some embodiments.
Figure 20:
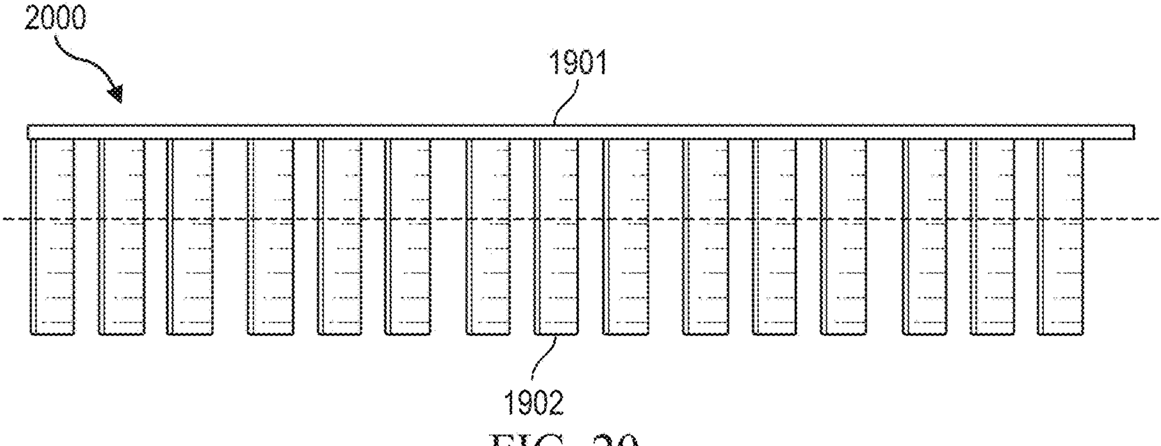
Figure 21:
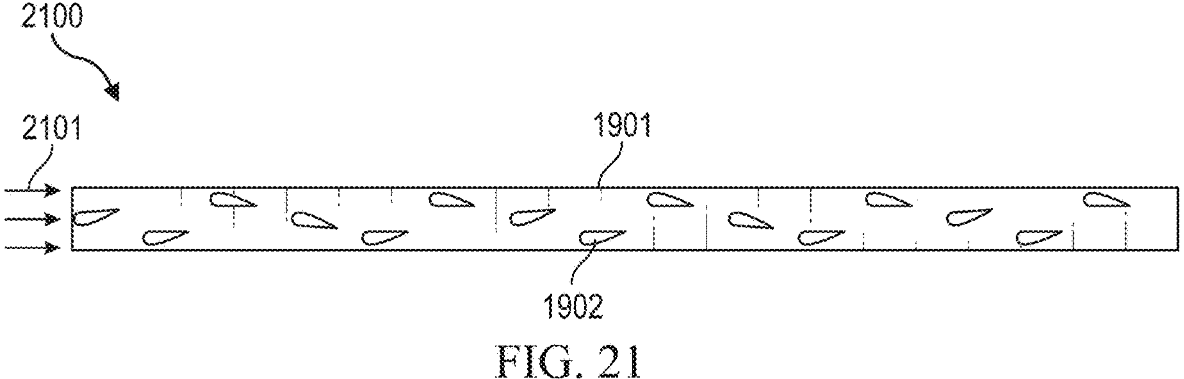
Figure 22:
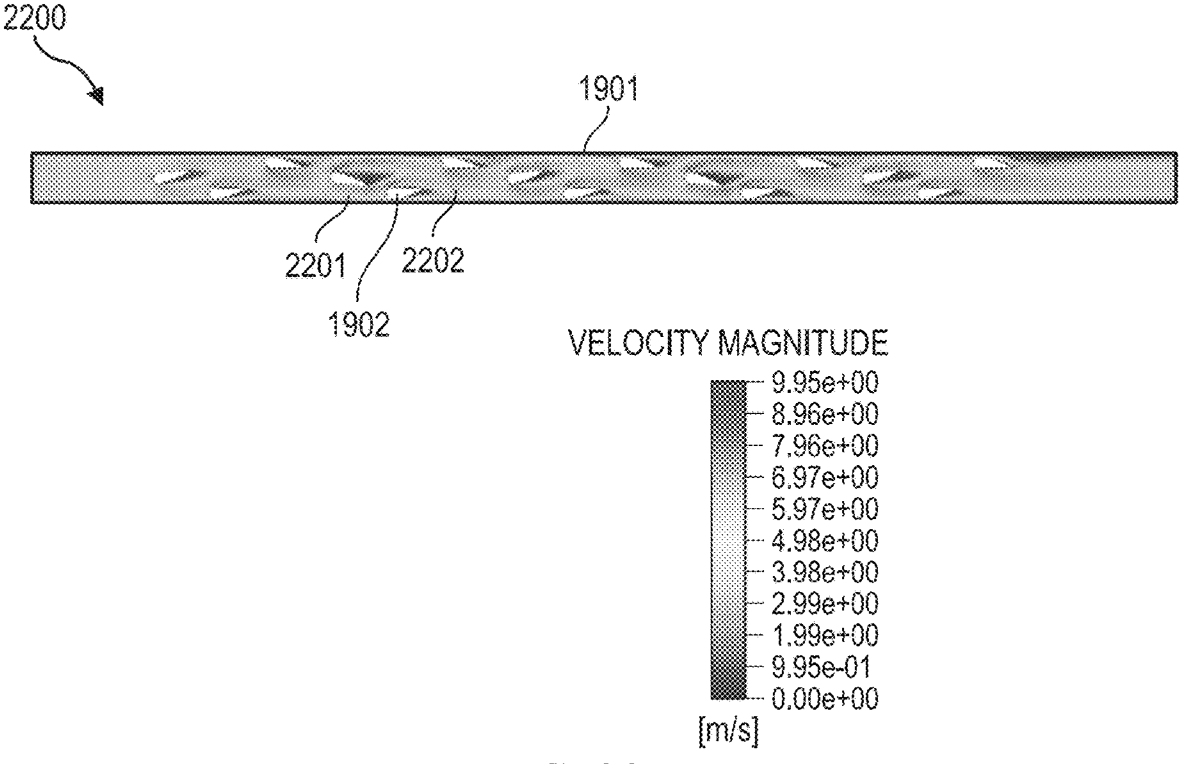

FIGS. 19-22 are diagrams illustrating an example of an air cooling insert with airfoil posts and associated features. FIG. 19 shows isometric view 1900 of an air cooling insert having top portion 1901 and airfoil posts 1902 vertically integrated or coupled thereto. FIG. 20 shows lateral view 2000 of the air cooling insert. FIG. 21 shows top view 2100 and indicates the flow direction of fluid 2101. In various embodiments, the number of airfoil posts 1902, the distance between airfoil posts 1902, the angle(s) between airfoil posts 1902, and/or the arrangement of airfoil posts 1902 may be selected based, at least in part, upon a viscosity of fluid 2101. FIG. 22 shows top view 2200 of the air cooling insert overlayed upon a velocity map of flow 2101, indicating velocity enhancements 2201 and serpentine flow pattern 2202. In some deployments, a plurality of air cooling inserts with airfoil posts may be provided in parallel as a multiple cooling insert similar to the example shown in FIG. 8.

Figure 26:
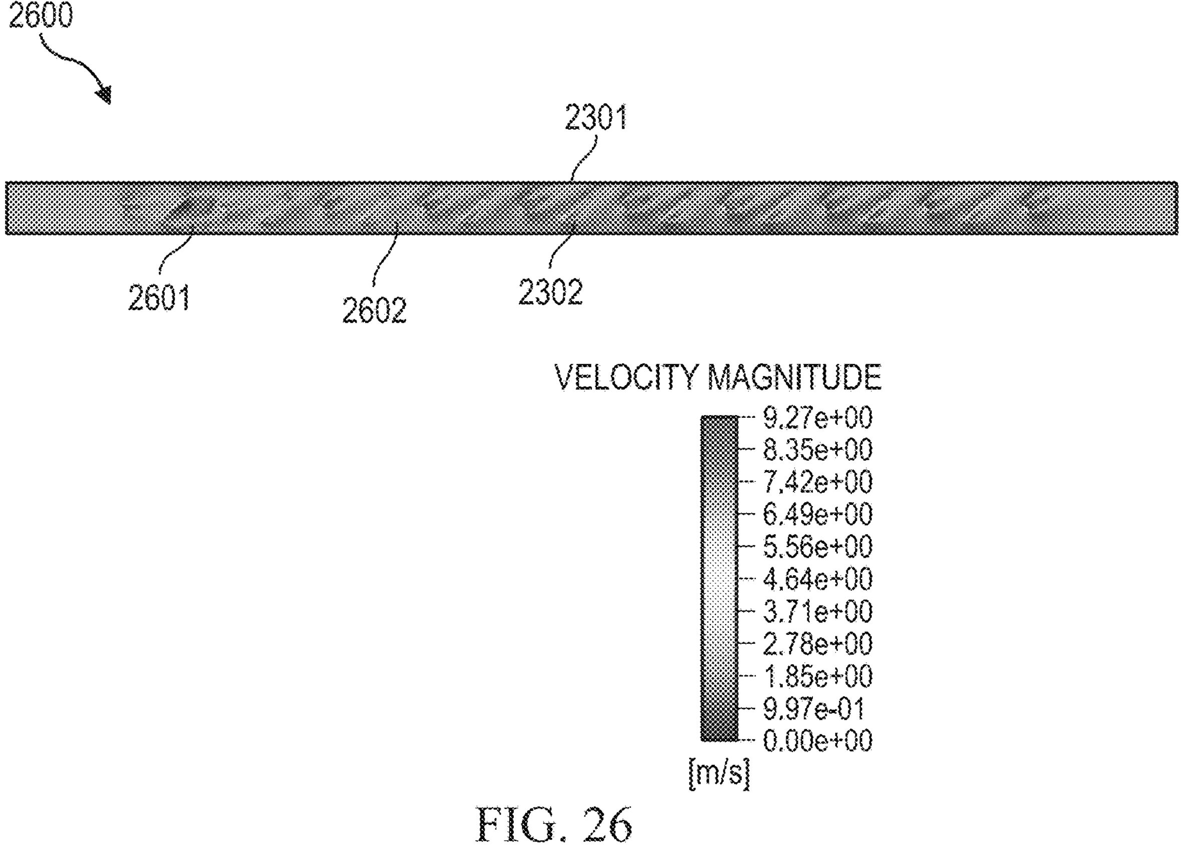

FIGS. 23-26 are diagrams illustrating an example of an air cooling insert with vanes and associated features. FIG. 23 shows isometric view 2300 of an air cooling insert having top portion 2301 and vanes 2302 vertically integrated or coupled thereto. FIG. 24 shows lateral view 2400 of the air cooling insert. FIG. 25 shows top view 2500 and indicates the flow direction of fluid 2501. In various embodiments, the number of vanes 2302, the distance between vanes 2302, the angle(s) between vanes 2302, and/or the arrangement of vanes 2302 may be selected based, at least in part, upon a viscosity of fluid 2501. FIG. 26 shows top view 2600 of the air cooling insert overlayed upon a velocity map of flow 2601, indicating velocity enhancements 2601 and serpentine flow pattern 2602. In some deployments, a plurality of air cooling inserts with vanes may be provided in parallel as a multiple cooling insert similar to the example shown in FIG. 8.

In some embodiments, air cooling inserts with different geometries (e.g., cylindrical posts, airfoil posts, vanes, etc.) may be used in the same IHS. Additionally, or alternatively, two or more different geometries, tapering, and/or cutouts may be combined in parallel as a multiple cooling insert similar to the example shown in FIG. 8.

In modern IHS designs, system integration continues to drive greater component density such that heat dissipation problems have become even more challenging. When traditional fan cooling cannot meet an IHS's demand for heat dissipation, liquid cooling may be an adequate alternative. Conventionally, two main types of liquid cooling have been developed, namely oil immersion, and Direct Contact Liquid Cooling (DCLC).

Immersion cooling refers to a technique in which components and other electronics, including complete IHS, are submerged in a thermally conductive dielectric liquid or coolant. Heat is removed from the system by circulating a dielectric liquid in direct contact with heat generating components, followed by cooling of the heated dielectric liquid using heat exchangers. Liquids suitable for immersion cooling should have relatively good insulating properties to ensure that they can safely meet the operational requirements of energized electronic components. In contrast, the DCLC approach uses the thermal conductivity of liquid to provide dense, concentrated cooling to specific surface areas of an IHS.

In various embodiments, systems and methods described herein may be deployed with both air cooling and liquid cooling mechanisms. Moreover, any of the "air cooled inserts" described herein may also be deployed in other fluids, gas or liquid.

In some cases, an entire IHS may be liquid cooled (e.g., submerged in a tank). In other cases, only a portion of the IHS may be liquid cooled. For example, a hybrid IHS may include an air cooled segment and a liquid cooled segment, and systems and methods described herein may be specifically adapted for each distinct segment.

Figure 27:
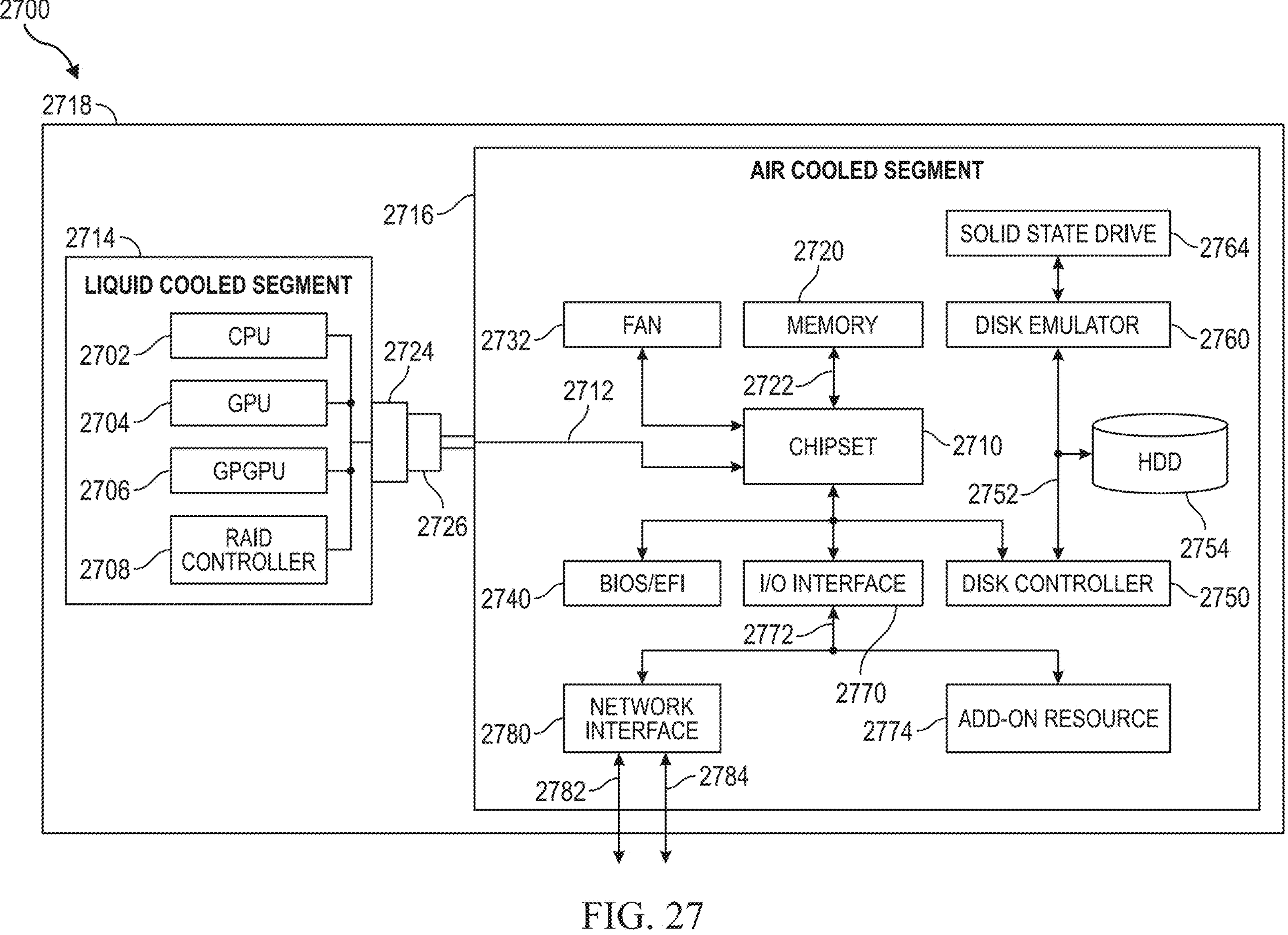
FIG. 27 is a diagram illustrating example components of an IHS, according to some embodiments.

In that regard, FIG. 27 illustrates an example IHS 2700 that may be implemented according to one embodiment of the present disclosure. In some implementations, IHS 2700 may include any IHS, such as a rack-mount server, a blade server, bare metal computing device, or any other device that processes instructions stored in a memory.

As shown, IHS 2700 includes one or more CPUs 2702, chipset 2710, memory 2720, Basic Input and Output System/Extensible Firmware Interface (BIOS/EFI) module 2740, disk controller 2750, disk emulator 2760, input/output (I/O) interface 2770, and network interface 2780. Memory 2720 is connected to chipset 2710 via memory bus 2722.

In a particular embodiment, IHS 2700 may include separate memories that are dedicated to each of multiple central processing units 2702 via separate memory interfaces. An example of memory 2720 includes random access memory (RAM) such as static RAM (SRAM), dynamic RAM (DRAM), non-volatile RAM (NV-RAM), or the like, read only memory (ROM), another type of memory, or a combination thereof.

IHS 2700 may also include fan 2732 that may be coupled to and controlled by chipset 2710 for cooling air cooled segment 2716. In some cases, by implementing systems and methods described herein, fan 2732 may be operated at lower speeds, thus leading to better acoustics and user experience.

BIOS/EFI module 2740, disk controller 2750, and I/O interface 2770 are connected to chipset 2710 via an I/O channel 2712. An example of I/O channel 2712 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 2710 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 2740 includes BIOS/EFI code operable to, among other things, detect resources within IHS 2700, to provide drivers for the resources, initialize the resources, and access the resources.

Disk controller 2750 may include disk interface 2752 that connects disc controller 2750 to hard disk drive (HDD) 2754 and to disk emulator 2760. An example of disk interface 2752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or any combination thereof.

Disk emulator 2760 may permit a solid-state drive 2764 to be connected to IHS 2700. An example of external interface 2762 includes a USB interface, an IEEE 1194 (Firewire) interface, a proprietary interface, or a combination thereof. Alternatively, solid-state drive 2764 can be disposed within IHS 2700.

I/O interface 2770 may include peripheral interface 2772 that connects the I/O interface to add-on resource 2774 and to network interface 2780. Peripheral interface 2772 may be the same type of interface as I/O channel 2712 or a different type of interface. As such, I/O interface 2770 extends the capacity of I/O channel 2712 when peripheral interface 2772 and I/O channel 2712 are of the same type, and I/O interface 2770 translates information from a format suitable to I/O channel 2712 to a format suitable to peripheral channel 2772 when they are of a different type.

Add-on resource 2774 can include a data storage system, an additional graphics interface, a network interface card (NIC), a sound/video processing card, another add-on resource, or a combination thereof. Add-on resource 2774 may be on a main circuit board, on separate circuit board or add-in card disposed within IHS 2700, a device that is external to the information handling system, or a combination thereof.

Network interface 2780 represents a NIC disposed within IHS 2700 on a main circuit board of IHS 2700, integrated onto another component such as chipset 2710, in another suitable location, or a combination thereof. Network interface device 2780 includes network channels 2782 and 2784 that provide interfaces to devices that are external to IHS 2700.

In a particular embodiment, network channels 2782 and 2784 may be of a different type than peripheral channel 2772 and network interface 2780 translates information from a format suitable to the peripheral channel to a format suitable to external devices. An example of network channels 2782 and 2784 includes InfiniBand channels, Fiber Channel channels, Gigabit Ethernet channels, proprietary channel architectures, or a combination thereof. Network channels 2782 and 2784 may be connected to external network resources (not illustrated). The network resource can include another IHS, a data storage system, another network, a grid management system, another suitable resource, or a combination thereof.

Certain high heat generating components of the IHS 2700 may be disposed in liquid cooled segment 2714 while other reduced heat generating components are disposed in air cooled segment 2716. For example, certain components (e.g., CPU 2702, graphics processing unit (GPU) 2704, general purpose computing on graphics processing units (GPGPU) 2706, and RAID controller 2708) described above typically generate relatively more heat during operation than their reduced heat generating component counterparts (e.g., memory 2720, disk emulator 2760, hard disk drive 2754, disk controller 2750, BIOS/EFI 2740, I/O interface 2770, network interface 2780, and add-on resource 2774).

High heat generating components generally refer to those components of a computing system (e.g., IHS) that generate a relatively high level of heat during their operation, while reduced heat generating components generally refer to other components that generate relatively lower levels of heat during their operation. In the example shown, high heat generating components may include CPU 2702, GPU 2704, GPGPU 2706, and RAID controller 2708. Nevertheless, it should be appreciated that other high heat generating components may include any component of a computing system that may not be adequately cooled using traditional airflow cooling techniques.

Reduced heat generating components, on the other hand, generally refer to those components that generate relatively lower levels of heat, and as such, may be adequately cooled using traditional air cooling techniques. In the embodiment shown, reduced heat generating components may include chipset 2710, memory 2720, disk emulator 2760, hard disk drive 2754, disk controller 2750, BIOS/EFI 2740, I/O interface 2770, network interface 2780, and add-on resource 2774. Nevertheless, it should be appreciated that reduced heat generating components may include any component of an IHS that may be adequately cooled using air cooling techniques.

In some situations, high heat generating components may not function properly when cooled only with conventional air cooling techniques. As such, high heat generating components may be disposed in a liquid cooled segment 2714, while reduced heat generating components may be disposed in an air cooled segment 2716.

IHS 2700 also includes chassis 2718 for removably receiving and securing the air cooled segment 2716 and liquid cooled segment 2714 in a generally fixed physical arrangement relative to one another. Liquid cooled segment 2714 includes leak-proof connector 2724 that may be mated with complementary connector 2726 configured on air cooled segment 2716 so that the high heat generating components configured in liquid cooled segment 2714 may be electrically coupled to the reduced heat generating components configured in air cooled segment 2716. Liquid cooled segment 2714 provides an enclosed space for immersion of the high heat generating components in a cooling liquid, while air cooled segment 2716 provides for air cooling of other reduced heat generating components that emit relatively less heat than their high heat generating component counterparts.

In various embodiments, systems and methods described herein may include adding at least one shroud to air cooled segment 2716 and/or liquid cooled segment 2714. A shroud is a device that channels fluid flow (e.g., from a cooling fan, pump, etc.) towards a specific area of the IHS's chassis and/or component(s), to facilitate heat exchange in that area, for example, in embodiments where high heat generating components are present.

Generally, a shroud may include one or more baffles configured to change the course of fluid flow, or to redirect it. As such, shrouds have many different geometries. In various embodiments, a shroud, as described herein, may include one or more cooling inserts to further enhance its heat transfer operations. Cooling inserts with twists, cutouts, and/or other geometries may be incorporated in a main portion, housing, cover, or shell of the shroud. In some cases, cooling inserts may be built into a shroud, which eliminates the need for a new, separate part installation.

Figure 28:
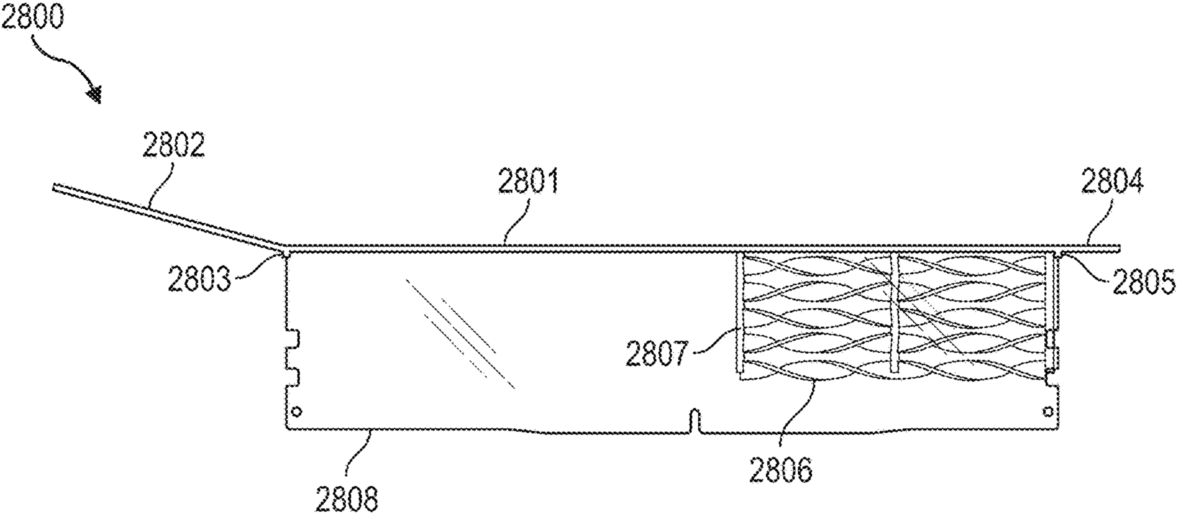
FIG. 28 is a diagram illustrating an example of a shroud with cooling inserts, according to some embodiments.
Figure 29:
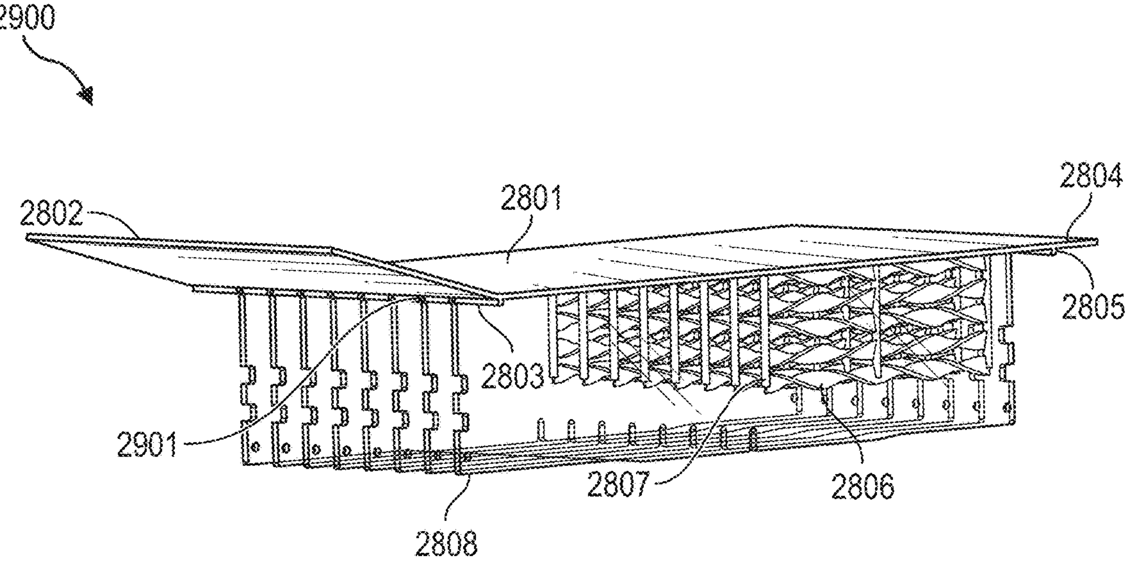
FIG. 29 is a diagram illustrating an isometric view of a shroud with cooling inserts, according to some embodiments.

FIG. 28 is a diagram illustrating an example of shroud 2800 with cooling inserts, and FIG. 29 provides isometric view 2900 of shroud 2800. In this implementation, shroud 2800 includes main portion or cover 2801 with two baffles 2802 and 2804. For example, baffle 2802 may be configured to direct fluid flow towards main portion or cover 2801, whereas baffle 2804 may be configured to direct fluid flow away from main portion or cover 2801.

Main portion or cover 2801 may be deployed over two or more components or modules (e.g., 2808, such as a DIMM bank or memory module) disposed in parallel with respect to each other, and cooling inserts (e.g., 2807) may be disposed between the two or more components or modules. Main portion or cover 2801 may also include edges 2803 and 2805 having slots or notches 2901 configured to prevent components (e.g., 2808) from moving in a direction perpendicular to the cooling inserts (e.g., 2807).

It should be noted that, in various implementations, shroud 2800 may assume any variety of shapes and forms. In this case, baffle 2802 is at a fixed, oblique angle with respect to main portion or cover 2801, whereas baffle 2804 is parallel to main portion or cover 2801 or continuous therewith. In other cases, different baffles may be used. Moreover, in some embodiments, main portion or cover 2801 may include lateral walls or a shell to further direct fluid flow through the cooling inserts (e.g., 2807).

In operation, fluid flows from left (intake) to right (outlet) of shroud 2800. In various embodiments, cooling inserts 2807 may include any of the cooling inserts, features, and variations described herein (e.g., twist, twist and slant, cutouts, tapering, other geometries, etc.). As shown in views 2800 and 2900, this example uses twists 2806.

In some cases, each of cooling inserts 2807 may extend from main portion or cover 2801 to a length that is shorter than the height of component 2808, for example to account for electrical terminals. Although view 2900 shows one cooling insert between adjacent components, in other implementations there may be two or more cooling inserts between them. Moreover, in some cases, fewer than all adjacent components may have cooling inserts therebetween.

Figure 30:
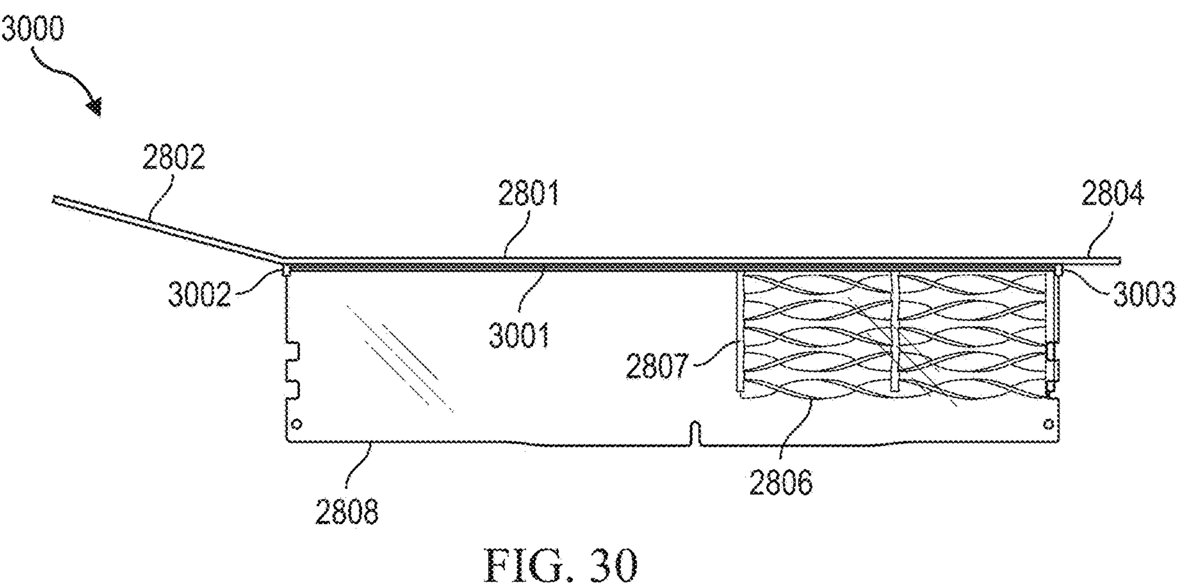
FIG. 30 is a diagram illustrating an example of a shroud assembly with cooling inserts, according to some embodiments.
Figure 31:
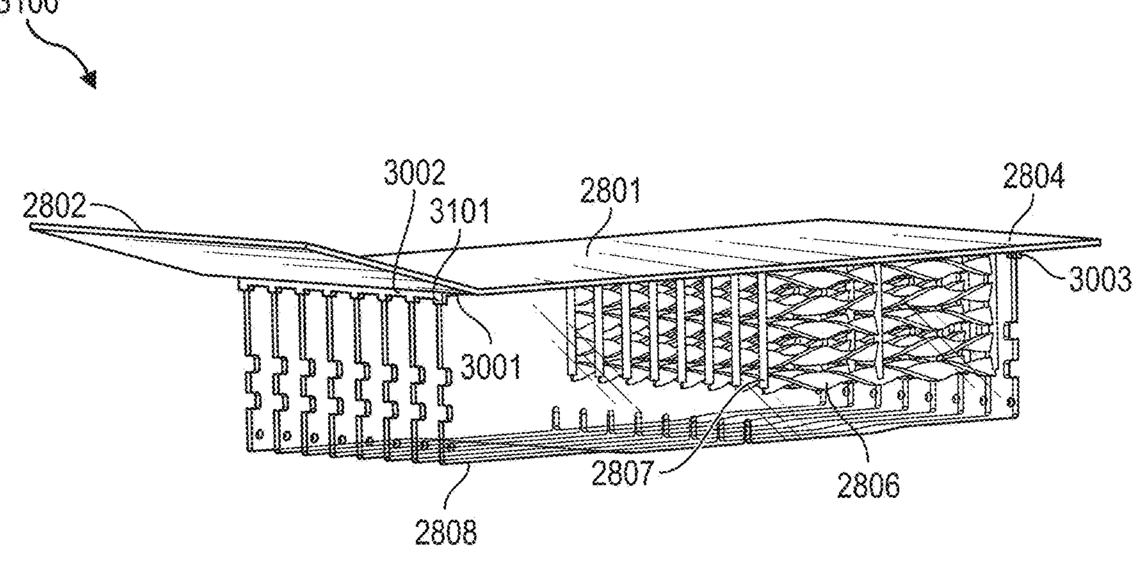
FIG. 31 is a diagram illustrating an isometric view of a shroud assembly with cooling inserts, according to some embodiments.

FIG. 30 is a diagram illustrating an example of shroud assembly 3000 with cooling inserts, and FIG. 31 provides isometric view 3100 of shroud assembly 3000. As in the previous implementation, here shroud 3000 includes main portion or cover 2801 with two baffles 2802 and 2804.

A cooling insert module including top portion 3001 and edges 3002 and 3003 is coupled to an underside of the main portion or cover 2801 (e.g., using glue, adhesive tape, fasteners, etc.), and it may be deployed over two or more components or modules (e.g., 2808). In this case, edges 3002 and 3003 may have stops or detents 3101 configured to prevent components (e.g., 2808) from moving in a direction parallel to the cooling inserts (e.g., 2807).

Still similarly as above, in various implementations, shroud assembly 3000 may assume any variety of shapes and forms. Although view 3100 shows one cooling insert between adjacent components, in other implementations there may be two or more cooling inserts between them. Moreover, in some cases, fewer than all adjacent components may have cooling inserts therebetween.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination thereof. Such configured devices are physically designed to perform the specified operation(s).

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs.

As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. A shroud, comprising:

a cover portion;

a baffle portion coupled to, or integrated into the cover portion, wherein the baffle portion is configured to direct fluid flow towards the cover portion; and a plurality of cooling inserts coupled to or integrated into the cover portion, wherein the cooling inserts are disposed in parallel with respect to each other, wherein at least one of the cooling inserts comprises: supports coupled to, or integrated into the cover, and twists coupled between two or more of the supports, and wherein a first twist has a first directional rotation, and wherein a second twist has a second directional rotation opposite the first directional rotation.

2. The shroud of claim 1, wherein the first directional rotation causes a first fluid flow having a third directional rotation that is substantially similar to the first directional rotation.

3. The shroud of claim 2, wherein the second directional rotation causes a second fluid flow having a fourth direction rotation substantially similar to the second directional rotation.

4. The shroud of claim 1, wherein a first twist comprises a cutout.

5. The shroud of claim 4, wherein the cutout has a shape selected from the group consisting of: a circle, a semi-circle, an oblong, an ellipse, a triangle, a rectangle, and a square.

6. The shroud of claim 4, wherein the cutout is disposed at a center of the first twist.

7. The shroud of claim 4, wherein cutout is disposed at an edge of the first twist.

8. The shroud of claim 1, wherein at least one of the cooling inserts comprises an insert portion coupled to, or integrated into the cover, and wherein the insert portion comprises posts selected from the group consisting of: a cylindrical post, an airfoil post, and a vane.

9. The shroud of claim 1, wherein the cover portion is configured to be deployed over a portion of an Information Handling System (IHS) comprising two or more components or modules disposed in parallel with respect to each other, and wherein the at least one of the cooling inserts is configured to be disposed between the two or more components or modules.

10. The shroud of claim 9, wherein the cover portion comprises two or more slots configured to prevent, upon installation, respective ones of the two or more components from moving in a direction perpendicular to the cooling inserts.

11. The shroud of claim 9, wherein the cover portion comprises two or more detents configured to prevent, upon installation, respective ones of the two or more components from moving in a direction parallel to the cooling inserts.

12. The shroud of claim 9, wherein at least one of the components comprises: a memory module, a Central Processing Unit (CPU), a Graphical Processing Unit (GPU), an audio Digital Signal Processor (aDSP), a Neural Processing Unit (NPU), a Tensor Processing Unit (TSU), a Neural Network Processor (NNP), an Intelligence Processing Unit (IPU), an Image Signal Processor (ISP), or a Video Processing Unit (VPU).

13. A shroud assembly, comprising:

a cover;

a cooling insert module coupled to an underside of the cover, wherein the cooling insert module comprises a top portion and a plurality of cooling inserts coupled to, or integrated into, the top portion, wherein the cooling inserts are disposed in parallel with respect to each other, wherein at least one of the cooling inserts comprises: supports coupled to, or integrated into the cover, and twists coupled between two or more of the supports, and wherein a first twist has a first directional rotation, and wherein a second twist has a second directional rotation opposite the first directional rotation; and a baffle coupled to or integrated into the cover, wherein the baffle is configured to direct fluid flow towards the cooling insert module.

14. The shroud assembly of claim 13, wherein the cooling inserts further comprise posts coupled to the top portion.

15. The shroud assembly of claim 14, wherein the twists comprise at least one of: a cutout or a tapered twist.

16. The shroud assembly of claim 14, wherein the posts comprise at least one of: a cylindrical post, an airfoil post, or a vane.

17. An Information Handling System (IHS), comprising:

a first component disposed in parallel with respect to a second component; and a shroud deployed over the first and second components, wherein the shroud comprises cooling inserts between the first and second components, wherein at least one of the cooling inserts comprises: supports coupled to, or integrated into the shroud, and twists coupled between two or more of the supports, and wherein a first twist has a first directional rotation, and wherein a second twist has a second directional rotation opposite the first directional rotation.

* * * * *